(12) United States Patent
Kim et al.

(10) Patent No.: US 11,270,960 B2
(45) Date of Patent: Mar. 8, 2022

(54) RADIO-FREQUENCY MODULE HAVING RF AND FRONT-END INTEGRATED CIRCUITS

(71) Applicant: Samsung Electro-Mechanics Co., Ltd., Suwon-si (KR)

(72) Inventors: Doo Il Kim, Suwon-si (KR); Bang Chul Ko, Suwon-si (KR); Sung Youl Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/930,748

(22) Filed: May 13, 2020

(65) Prior Publication Data

US 2021/0210441 A1     Jul. 8, 2021

(30) Foreign Application Priority Data

Jan. 2, 2020   (KR) ........................ 10-2020-0000403

(51) Int. Cl.
*H01L 23/66*     (2006.01)
*H01L 23/538*    (2006.01)
(Continued)

(52) U.S. Cl.
CPC .......... *H01L 23/66* (2013.01); *H01L 23/5385* (2013.01); *H01L 23/5386* (2013.01);
(Continued)

(58) Field of Classification Search
CPC . H01L 23/66; H01L 23/5385; H01L 23/5386; H01L 23/5387; H01L 24/16; H01L 27/323; H01L 27/3276; H01L 25/0655; H01L 25/042; H01L 25/072; H01L 25/115; H01L 25/0753; H01L 25/162; H01L 51/0097; H01L 51/5237;
(Continued)

(56) References Cited

U.S. PATENT DOCUMENTS 8,377,746 B2 *   2/2013   Harper ................ H01L 23/3128
                                                      438/109
10,515,924 B2 * 12/2019  Babcock ............... H01L 23/552
(Continued)

FOREIGN PATENT DOCUMENTS

KR    10-2019-0019802 A   2/2019
KR    10-2019-0029429 A   3/2019

*Primary Examiner* — Ida M Soward
(74) *Attorney, Agent, or Firm* — NSIP Law

(57) ABSTRACT

A radio-frequency module includes a radio-frequency integrated circuit (RFIC) including a base connection terminal, and a first radio-frequency (RF) connection terminal; a first connection member including a mounting area on which the RFIC is mounted, a base wiring electrically connected to the base connection terminal of the RFIC, and a first RF wiring electrically connected to the first RF connection terminal of the RFIC; a second connection member including a second RF wiring electrically connected to the first RF wiring of the first connection member, and a third RF wiring, at least a portion of the second connection member being more flexible than the first connection member; and a front-end integrated circuit (FEIC) mounted on the second connection member and configured to amplify the first RF signal to generate the first communications signal or amplify the first communications signal to generate the first RF signal.

13 Claims, 14 Drawing Sheets

(51) Int. Cl.
*H01L 27/32* (2006.01)
*H01L 25/065* (2006.01)
*H01L 25/04* (2014.01)
*H01L 25/07* (2006.01)
*H01L 25/11* (2006.01)
*H01L 25/16* (2006.01)
*H01L 51/00* (2006.01)
*H01L 51/52* (2006.01)
*H01L 23/00* (2006.01)
*H01P 5/04* (2006.01)
*H01Q 9/04* (2006.01)
*H01L 25/075* (2006.01)

(52) U.S. Cl.
CPC .......... *H01L 23/5387* (2013.01); *H01L 24/16* (2013.01); *H01L 27/323* (2013.01); *H01L 27/3276* (2013.01); *H01L 51/0097* (2013.01); *H01L 51/5237* (2013.01); *H01P 5/04* (2013.01); *H01Q 9/0407* (2013.01); *H01L 25/042* (2013.01); *H01L 25/0655* (2013.01); *H01L 25/072* (2013.01); *H01L 25/0753* (2013.01); *H01L 25/115* (2013.01); *H01L 25/162* (2013.01); *H01L 2223/6627* (2013.01); *H01L 2223/6677* (2013.01); *H01L 2224/16225* (2013.01); *H01L 2251/5338* (2013.01)

(58) Field of Classification Search
CPC ... H01L 2224/16225; H01L 2251/5338; H01L 2223/6677; H01L 2223/6627
See application file for complete search history.

(56) References Cited

U.S. PATENT DOCUMENTS

| | | | |
|---|---|---|---|
| 10,622,703 | B2 | 4/2020 | Hong et al. |
| 10,790,162 | B2* | 9/2020 | Tsai ..................... H01L 23/5226 |
| 10,886,593 | B2* | 1/2021 | Chiang ................... H03H 7/38 |
| 10,964,657 | B2* | 3/2021 | Nakazawa .............. H01L 24/14 |
| 10,978,382 | B2* | 4/2021 | Lai ...................... H01L 23/4006 |
| 2017/0256480 | A1* | 9/2017 | Reingruber ....... H01L 23/49822 |
| 2018/0197829 | A1* | 7/2018 | Stiebler ............ H01L 23/49822 |
| 2019/0027808 | A1 | 1/2019 | Mow et al. |
| 2019/0058264 | A1 | 2/2019 | Jung et al. |
| 2019/0081387 | A1 | 3/2019 | Pandya et al. |
| 2019/0101636 | A1* | 4/2019 | Trotta .................... G01S 13/88 |
| 2019/0219687 | A1* | 7/2019 | Baheti ................... A61B 5/021 |
| 2020/0251407 | A1* | 8/2020 | Chun ................. H01L 23/4985 |
| 2020/0253040 | A1* | 8/2020 | Dalmia .................. H01L 25/18 |
| 2021/0111156 | A1* | 4/2021 | Elsherbini ............ H01L 25/105 |

\* cited by examiner

RADIO-FREQUENCY MODULE HAVING RF AND FRONT-END INTEGRATED CIRCUITS

CROSS-REFERENCE RELATED TO APPLICATIONS

This application claims the benefit under 35 USC 119(a) of Korean Patent Application No. 10-2020-0000403 filed on Jan. 2, 2020, in the Korean Intellectual Property Office, the entire disclosure of which is incorporated herein by reference for all purposes.

BACKGROUND

1. Field

This application relates to a radio-frequency module and an electronic device including the same.

2. Description of Related Art

Data traffic for mobile communications is increasing rapidly every year. Technological development is underway to support the transmission of this rapidly increasing data traffic in real time in wireless networks. For example, Internet of Things (IoT)-based data, augmented reality (AR), virtual reality (VR), live VR/AR in combination with social networking services (SNS), autonomous navigation, and Sync View (real-time video user transmissions using ultra-small cameras) necessitate communications methods (e.g., 5th generation (5G) communications and millimeter wave (mmWave) communications) supporting the transmission and reception of large amounts of data.

Recently, mmWave communications, including 5G communications, have been researched, and research into the commercialization and standardization of an antenna module for smoothly realizing such communications is progressing.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a radio-frequency module includes a radio-frequency integrated circuit (RFIC) including a base connection terminal configured to transmit a base signal, and a first radio-frequency (RF) connection terminal configured to transmit a first RF signal having a frequency higher than a frequency of the base signal; a first connection member including a mounting area on which the RFIC is mounted, a base wiring electrically connected to the base connection terminal of the RFIC and configured to transmit the base signal, and a first RF wiring electrically connected to the first RF connection terminal of the RFIC and configured to transmit the first RF signal; a second connection member including a second RF wiring electrically connected to the first RF wiring of the first connection member and configured to transmit the first RF signal, and a third RF wiring configured to transmit a first communications signal having a frequency higher than the frequency of the base signal, at least a portion of the second connection member being more flexible than the first connection member; and a front-end integrated circuit (FEIC) mounted on the second connection member, electrically connected to the second RF wiring and the third RF wiring of the second connection member, and configured to amplify the first RF signal to generate the first communications signal or amplify the first communications signal to generate the first RF signal.

The second connection member may be electrically connected to the first connection member through a first outer side of the second connection member, and the third RF wiring may be electrically connected to a second outer side of the second connection member different from the first outer side of the second connection member.

The third RF wiring may include an impedance transformer configured to have a first transmission line impedance in a first direction, and a second transmission line impedance different from the first transmission line impedance in a second direction different from the first direction.

The radio-frequency module may further include an electrical connection structure electrically connected to the base wiring of the first connection member and disposed on a first surface of the first connection member, wherein the RFIC may be mounted on a second surface of the first connection member.

The RFIC may be mounted on a first surface of the first connection member, and the radio-frequency module may further include a support member disposed on the first surface of the first connection member, configured to surround at least a portion of the RFIC, and electrically connected to the base wiring of the first connection member.

The radio-frequency module may further include an antenna package mounted on a second surface of the first connection member, and including a plurality of patch antennas electrically connected to the RFIC through the first connection member.

The radio-frequency module may further include a power management integrated circuit (PMIC) mounted on the first connection member and configured to supply power to the RFIC and the FEIC.

The second connection member may include a middle portion on which the FEIC is mounted, and two end portions disposed at opposite ends of the middle portion, and a thickness of the middle portion may be greater than respective thicknesses of the two end portions.

The RFIC may further include a second RF connection terminal configured to transmit a second communications signal having a frequency higher than the frequency of the base signal, the first connection member may further include a first feedline electrically connected to the second RF connection terminal of the RFIC and configured to transmit the second communications signal, the second connection member may further include a second feedline electrically connected to the first feedline of the first connection member and configured to transmit the second communications signal, and the radio-frequency module may further include an antenna component mounted on the second connection member, electrically connected to the second feedline of the second connection member, and configured to transmit or receive the second communications signal.

The antenna component may include an antenna dielectric layer having a dielectric constant higher than a dielectric constant of the second connection member; a feed connection terminal disposed on the antenna dielectric layer, electrically connected to the second feedline of the second connection member, and configured to transmit the second communications signal; a feed via disposed in the antenna dielectric layer, electrically connected to the feed connection terminal, and configured to transmit the second communications signal; and an antenna pattern disposed on or in the antenna dielectric layer, electrically connected to the feed via, and configured to transmit or receive the second communications signal.

The FEIC and the antenna component may be respectively mounted on different surfaces of the second connection member.

A frequency band of the antenna component may be higher than the frequency of the first communications signal.

The radio-frequency module may further include an antenna component mounted on the second connection member, electrically connected to a second feedline, and configured to transmit or receive a second communications signal, wherein the RFIC may further include a second RF connection terminal configured to transmit a second communications signal, the first connection member may further include a first feedline electrically connected to the second RF connection terminal of the RFIC and configured to transmit the second communications signal, the second connection member may further include a second feedline electrically connected to the first feedline of the first connection member, the radio-frequency module may further include an antenna component mounted on the second connection member and further configured to transmit and receive the second communications signal, and the FEIC may be electrically connected between the second feedline of the second connection member and the antenna component and may be configured to further amplify the second communications signal.

In another general aspect, a radio-frequency module includes a radio-frequency integrated circuit (RFIC) including a base connection terminal configured to transmit a base signal, a first radio-frequency (RF) connection terminal configured to transmit a first RF signal having a frequency higher than a frequency of the base signal, and a second RF connection terminal configured to transmit a second communications signal having a frequency higher than the frequency of the base signal; a first connection member including a mounting area on which the RFIC is mounted, a base wiring electrically connected to the base connection terminal of the RFIC and configured to transmit the base signal, a first RF wiring electrically connected to the first RF connection terminal of the RFIC and configured to transmit the first RF signal, and a first feedline electrically connected to the second RF connection terminal of the RFIC and configured to transmit the second communications signal; a second connection member including a second RF wiring electrically connected to the first RF wiring of the first connection member and configured to transmit the first communications signal, and a second feedline electrically connected to the first feedline of the first connection member and configured to transmit the second communications signal, a least a portion of the second connection member being more flexible than the first connection member; and an antenna component mounted on the second connection member, electrically connected to the second feedline of the second connection member, and configured to transmit or receive the second communications signal, wherein the second connection member is electrically connected to the first connection member through a first outer side of the second connection member, and the second RF wiring is electrically connected to a second outer side of the second connection member different from the first outer side of the second connection member.

The second RF wiring of the second connection member may include an impedance transformer configured to have a first transmission line impedance in a first direction, and a second transmission line impedance different from the first transmission line impedance in a second direction different from the first direction.

The RFIC may be mounted on a first surface of the first connection member and may include a third RF connection terminal configured to transmit a third communications signal having a frequency higher than the frequency of the base signal, and the radio-frequency module may further include a support member disposed on the first surface of the first connection member, configured to surround at least a portion of the RFIC, and including a base connection terminal, and a base wiring electrically connected between the base connection terminal of the support member and the base connection terminal of the RFIC; and an antenna package mounted on a second surface of the first connection member and including a plurality of patch antennas electrically connected to the third RF connection terminal of the RFIC through the first connection member and configured to transmit or receive the third communications signal.

The antenna component may include an antenna dielectric layer having a dielectric constant higher than a dielectric constant of the second connection member; a feed connection terminal disposed on the antenna dielectric layer, electrically connected to the second feedline of the second connection member, and configured to transmit the second communications signal; a feed via disposed in the antenna dielectric layer, electrically connected to the feed connection terminal, and configured to transmit the second communications signal; and an antenna pattern disposed on or in the antenna dielectric layer, electrically connected to the feed via, and configured to transmit or receive the second communications signal.

A frequency band of the antenna component may be higher than a frequency of the first communications signal.

In another general aspect an electronic device includes a radio-frequency integrated circuit (RFIC) including a base connection terminal configured to transmit a base signal, a first radio-frequency (RF) connection terminal configured to transmit a first RF signal having a frequency higher than a frequency of the base signal, and a second RF connection terminal configured to transmit a second communications signal having a frequency higher than the frequency of the base signal; a base substrate including a base wiring configured to transmit the base signal; a first connection member mounted on the base substrate and including a mounting area on which the RFIC is mounted, a base electrical connection structure electrically connected to the base wiring of the base substrate and configured to transmit the base signal, a base wiring electrically connected between the base electrical connection structure of the first connection member and the base connection terminal of the RFIC and configured to transmit the base signal, a first RF wiring electrically connected to the first RF connection terminal of the RFIC and configured to transmit the first RF signal, and a first feedline electrically connected to the second RF connection terminal of the RFIC and configured to transmit the second communications signal; a second connection member including a second RF wiring electrically connected to the first RF wiring of the first connection member and configured to transmit the first RF signal, and a second feedline electrically connected to the first feedline of the first connection member and configured to transmit the second communications signal; a display member configured to display an image; an antenna coupled to the display member, electrically connected to the second RF wiring of the second connection member, and configured to receive or transmit the first RF signal or a first communications signal corresponding to the first RF signal; and an antenna component mounted on the second connection member, electrically connected to the second feedline of the second connection member, and configured to transmit or receive the second communications signal.

An antenna radiation direction of the antenna component may be different from an antenna radiation direction of the antenna coupled to the display member.

The RFIC may further include an antenna package mounted on the first connection member or the base substrate and configured to transmit or receive a third communications signal in a direction different from the antenna radiation direction of the antenna component and the antenna radiation direction of the antenna coupled to the display member.

The second RF wiring of the second connection member may include a first portion electrically connected to the first RF wiring of the first connection member and configured to transmit the first RF signal, and a second portion electrically connected to the antenna coupled to the display member and configured to transmit the first communications signal corresponding to the first RF signal, the electronic device may further include a front-end integrated circuit (FEIC) mounted on the second connection member, electrically connected to the first portion and the second portion of the second RF wiring of the second connection member, and configured to amplify the first RF signal to generate the first communications signal corresponding to the first RF signal or amplify the first communications signal corresponding to the first RF signal to generate the first RF signal, and the antenna coupled to the display member may be further configured to transmit or receive the first communications signal corresponding to the first RF signal.

The electronic device may further including a power management integrated circuit (PMIC) disposed on the first connection member or the base substrate and configured to supply power to the RFIC and the FEIC.

The second connection member may include a middle portion on which the FEIC is mounted, and two end portions disposed at opposite ends of the middle portion, and a thickness of the middle portion may be greater than respective thicknesses of the two end portions.

The FEIC and the antenna component may be respectively disposed on different surfaces of the second connection member.

A frequency band of the antenna component may be higher than a frequency band of the antenna coupled to the display member.

In another general aspect, an electronic device includes a radio-frequency integrated circuit (RFIC) including a base connection terminal configured to transmit a base signal, and a first radio-frequency (RF) connection terminal configured to transmit a first RF signal having a frequency higher than a frequency of the base signal; a base substrate including a base wiring configured to transmit the base signal; a first connection member mounted on the base substrate and including a mounting area on which the RFIC is mounted, a base electrical connection structure electrically connected to the base wiring of the base substrate and configured to transmit the base signal, a base wiring electrically connected to the base electrical connection structure of the first connection member and the base connection terminal of the RFIC and configured to transmit the base signal, and a first RF wiring electrically connected to the first RF connection terminal of the RFIC and configured to transmit the first RF signal; a second connection member including a second RF wiring electrically connected to the first RF wiring of the first connection member and configured to transmit the first RF signal, and a third RF wiring configured to transmit a first communications signal; a display member configured to display an image; an antenna coupled to the display member and electrically connected to the third RF wiring and configured to transmit or receive the first communications signal; and a front-end integrated circuit (FEIC) mounted on the second connection member, electrically connected to the second RF wiring and the third RF wiring of the second connection member, and configured to amplify the first RF signal to generate the first communications signal or amplify the first communications signal to generate the first RF signal.

At least a portion of the second connection member may be more flexible than the first connection member.

In another general aspect, a radio-frequency module includes a radio-frequency integrated circuit (RFIC) including a base connection terminal configured to transmit a base signal, wherein the RFIC further includes a first radio-frequency (RF) connection terminal configured to transmit an RF signal having a frequency higher than a frequency of the base signal, or the RFIC further includes the first RF connection terminal configured to transmit the first RF signal, and a second RF connection terminal configured to transmit a second communications signal having a frequency higher than the frequency of the base signal.

In this general aspect, the radio-frequency module further includes a first connection member on which the RFIC is mounted, the first connection member including a base wiring electrically connected to the base connection terminal of the RFIC, wherein the first connection member further includes a first RF wiring electrically connected to the first RF connection terminal of the RFIC, or the first connection member further includes the first RF wiring electrically connected to the first RF connection terminal of the RFIC, and a first feedline electrically connected to the second RF connection terminal of the RFIC.

In this general aspect, the radio-frequency module further includes a second connection member having a first outer side connected to an outer side of the first connection member, at least a portion of the second connection member being more flexible than the first connection member, wherein the second connection member includes a second RF wiring electrically connected to the first RF wiring of the first connection member and extending to a first point in the second connection member, and a third RF wiring extending from a second point in the second connection member to a second outer side of the second connection member, or the second connection member includes a second RF wiring electrically connected to the first RF wiring of the first connection member and extending to the second outer side of the second connection member, and a second feedline electrically connected to the first feedline of the first connection member, or the second connection member includes the second RF wiring electrically connected to the first RF wiring of the first connection member and extending to the first point in the second connection member, the third RF wiring extending from the second point in the second connection member to the second outer side of the second connection member, and the second feedline electrically connected to the first feedline of the first connection member.

In this general aspect, the radio-frequency module further includes a front-end integrated circuit (FEIC) mounted on the second connection member, configured to amplify the first RF signal to generate a first communications signal having a frequency higher than the frequency of the base signal or amplify the first communications signal to generate the first RF signal, and including a first front-end (FE) connection terminal configured to transmit the first RF signal and electrically connected to the second RF wiring of the second connection member at the second point in the second connection member, and a second FE connection terminal configured to transmit the first communications signal and electrically connected to the third RF wiring of the second connection member at the second point in the second connection member, or the radio-frequency module further includes an antenna component mounted on the second connection member, configured to transmit or receive the first communications signal, and electrically connected to the second feedline of the second connection member, wherein the second connection member includes the second RF wiring electrically connected to the first RF wiring of the first connection member and extending to the second outer side of the second connection member, or the radio-frequency module further includes the FEIC including the first FE connection terminal electrically connected to the second RF wiring of the second connection member and the second FE connection terminal electrically connected to the third RF wiring of the second connection member, and the antenna component electrically connected to the second feedline of the second connection member.

The RFIC may include the base connection terminal, the first RF connection terminal, the second RF connection terminal, and a third RF connection terminal configured to transmit a third communications signal having a frequency higher than the frequency of the base signal, the first connection member may include the first RF wiring, the second RF wiring, and a third feedline electrically connected to the third RF connection terminal of the RFIC, the second connection member may include the second RF wiring electrically connected to the first RF wiring of the first connection member and extending to the first point in the second connection member, the third RF wiring extending from the second point in the second connection member to the second outer side of the second connection member, and the second feedline electrically connected to the first feedline of the first connection member, and the radio-frequency module may further include the FEIC including the first FE connection terminal electrically connected to the second RF wiring of the second connection member and the second FE connection terminal electrically connected to the third RF wiring of the second connection member; the antenna component electrically connected to the second feedline of the second connection member; and an antenna package mounted on the first connection member, configured to transmit or receive the third communications signal, and electrically connected to the third feedline of the first connection member.

The second connection member may include a middle portion on which either one or both of the FEIC and the antenna component are mounted, and two end portions disposed at opposite ends of the middle portion, and a thickness of the middle portion may be greater than respective thicknesses of the two end portions.

The radio-frequency module may include the FEIC and the antenna component, and a frequency band of the antenna component may be higher than the frequency of the first communications signal.

In another general aspect, an electronic device includes a radio-frequency integrated circuit (RFIC) including a base connection terminal configured to transmit a base signal, wherein the RFIC further includes a first radio-frequency (RF) connection terminal configured to transmit a first RF signal having a frequency higher than a frequency of the base signal, or the RFIC further includes the first RF connection terminal configured to transmit the first RF signal, and a second RF connection terminal configured to transmit a second communications signal having a frequency higher than the frequency of the base signal.

In this general aspect, the radio-frequency module further includes a base substrate comprising a base wiring configured to transmit the base signal.

In this general aspect, the radio-frequency module further includes a first connection member on which the RFIC is mounted, the first connection member being mounted on the base substrate and including a base electrical connection structure electrically connected to the base wiring of the base substrate, and a base wiring electrically connected between the base electrical connection structure of the first connection member and the base connection terminal of the RFIC, wherein the first connection member further includes a first RF wiring electrically connected to the first RF connection terminal of the RFIC, or the first connection member further includes the first RF wiring electrically connected to the first RF connection terminal of the RFIC, and a first feedline electrically connected to the second RF connection terminal of the RFIC.

In this general aspect, the radio-frequency module further includes a second connection member having a first outer side connected to an outer side of the first connection member, at least a portion of the second connection member being more flexible than the first connection member, wherein the second connection member includes a second RF wiring electrically connected to the first RF wiring of the first connection member and extending to a first point in the second connection member, and a third RF wiring extending from a second point in the second connection member to a second outer side of the second connection member, or the second connection member includes a second RF wiring electrically connected to the first RF wiring of the first connection member and extending to the second outer side of the second connection member, and a second feedline electrically connected to the first feedline of the first connection member, or the second connection member includes the second RF wiring electrically connected to the first RF wiring of the first connection member and extending to the first point in the second connection member, the third RF wiring extending from the second point in the second connection member to the second outer side of the second connection member, and the second feedline electrically connected to the first feedline of the first connection member.

In this general aspect, the radio-frequency module further includes a display member configured to display an image.

In this general aspect, the radio-frequency module further includes an antenna coupled to the display member, wherein the antenna coupled to the display member is electrically connected to the third RF wiring of the second connection member extending to the second outer side of the second connection member and is configured to transmit or receive a first communications signal having a frequency higher than the base signal, or the antenna coupled to the display member is electrically coupled to the second RF wiring extending to the second outer side of the second connection member, and is configured to receive or transmit the first RF signal.

In this general aspect, the radio-frequency module further includes a front-end integrated circuit (FEIC) mounted on the second connection member, configured to amplify the first RF signal to generate the first communications signal or amplify the first communications signal to generate the first RF signal, and including a first front-end (FE) connection terminal configured to transmit the first RF signal and electrically connected to the second RF wiring of the second connection member at the second point in the second connection member, and a second FE connection terminal configured to transmit the first communications signal and electrically connected to the third RF wiring of the second connection member at the second point in the second connection member, or the radio-frequency module further includes an antenna component mounted on the second connection member, configured to transmit or receive the first communications signal, and electrically connected to the second feedline of the second connection member, wherein the second connection member includes the second RF wiring electrically connected to the first RF wiring of the first connection member and extending to the second outer side of the second connection member, or the radio-frequency module further includes the FEIC including the first FE connection terminal electrically connected to the second RF wiring of the second connection member and the second FE connection terminal electrically connected to the third RF wiring of the second connection member, and the antenna component electrically connected to the second feedline of the second connection member.

The RFIC may include the base connection terminal, the first RF connection terminal, the second RF connection terminal, and a third RF connection terminal configured to transmit a third communications signal having a frequency higher than the frequency of the base signal, the first connection member may include the first RF wiring, the second RF wiring, and a third feedline electrically connected to the third RF connection terminal of the RFIC, the second connection member may include the second RF wiring electrically connected to the first RF wiring of the first connection member and extending to the first point in the second connection member, the third RF wiring extending from the second point in the second connection member to the second outer side of the second connection member, and the second feedline electrically connected to the first feedline of the first connection member, and the radio-frequency module may further include the FEIC including the first FE connection terminal electrically connected to the second RF wiring of the second connection member and the second FE connection terminal electrically connected to the third RF wiring of the second connection member; the antenna component electrically connected to the second feedline of the second connection member; and an antenna package mounted on the first connection member, configured to transmit or receive the third communications signal, and electrically connected to the third feedline of the first connection member.

An antenna radiation direction of the antenna component may be different from a radiation direction of the antenna coupled to the display member, and a radiation direction of the antenna package may be different from the antenna radiation direction of the antenna component and different from the antenna radiation direction of the antenna coupled to the display member.

The radio-frequency module may include the FEIC and the antenna component, and a frequency band of the antenna component may be higher than the frequency of the first communications signal.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
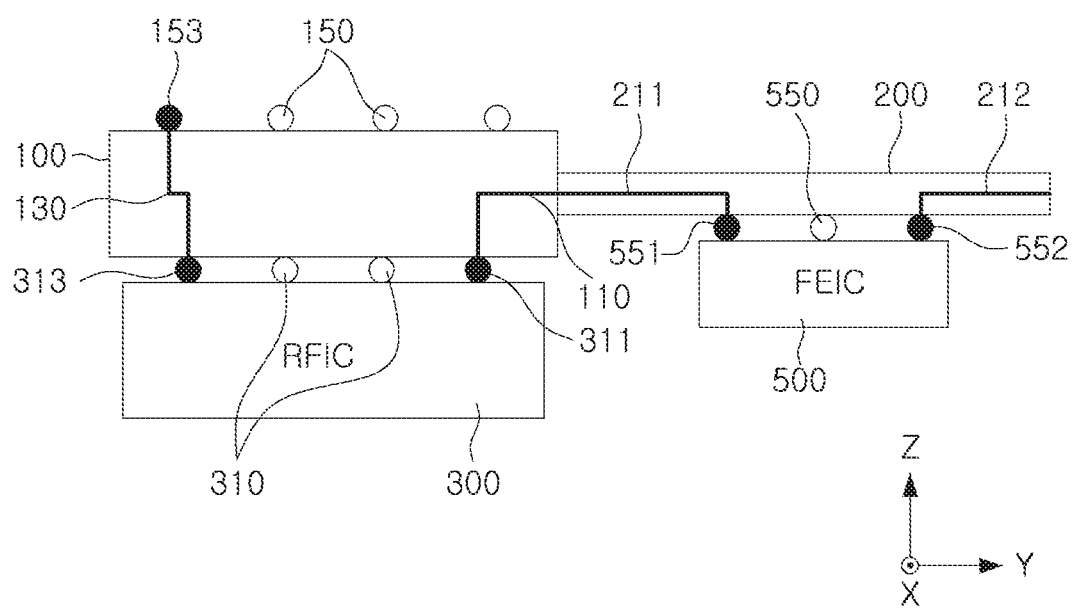
FIGS. 1A to 1C are views illustrating examples of a radio-frequency module.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Figure 1B:
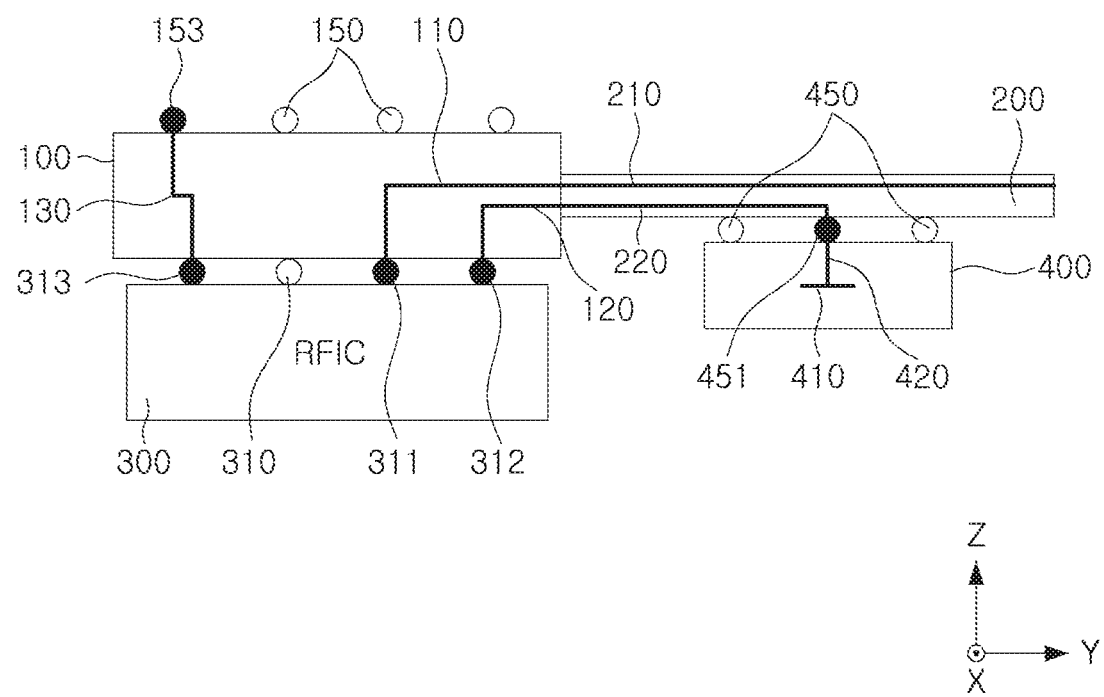
Figure 1C:
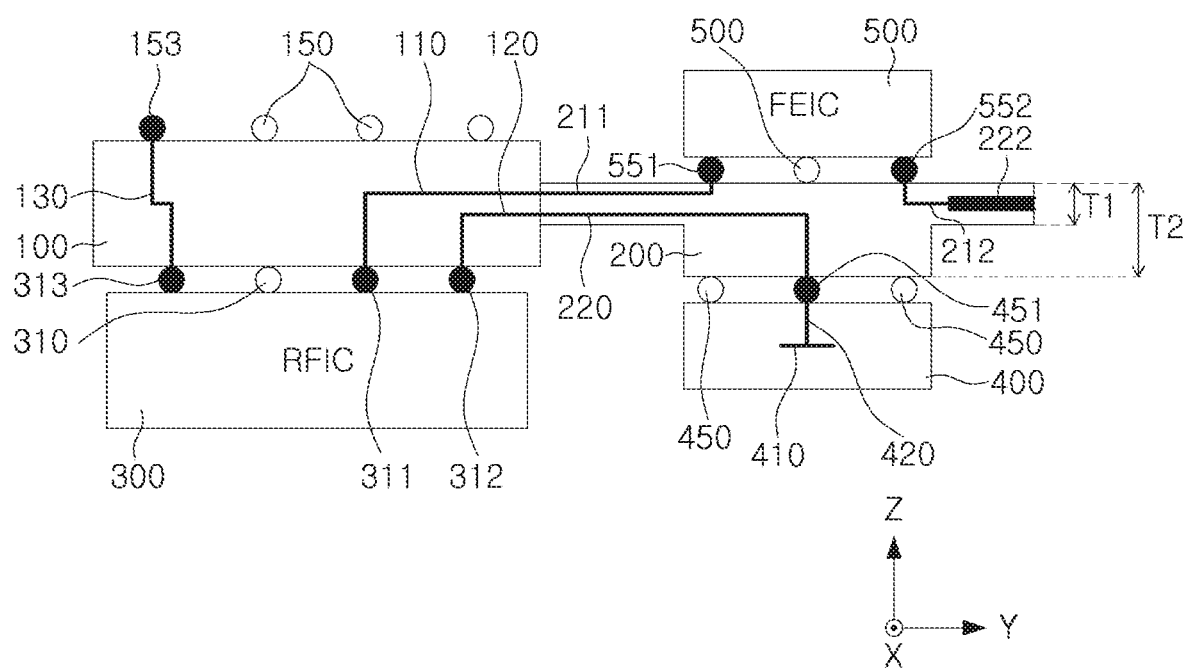

FIGS. 1A to 1C are views illustrating examples of a radio-frequency module.

Referring to FIG. 1A, a radio-frequency module 10a may include a radio-frequency integrated circuit (RFIC) 300, a first connection member 100, a second connection member 200, and a front-end integrated circuit (FEIC) 500.

The RFIC 300 may include a base connection terminal 313 configured to transmit a base signal, and a first RF connection terminal 311 configured to transmit a first radio-frequency (RF) signal having a frequency higher than a frequency of the base signal.

The RFIC 300 may include a plurality of connection terminals 310 electrically connecting the RFIC 300 to the first connection member 100. The plurality of connection terminals 310 may include the first RF connection terminal 311 and the base connection terminal 313.

For example, the plurality of connection terminals 310 may be implemented as pins of the RFIC 300, or solder balls, pads, or lands of the first connection member 100, and may support mounting of the RFIC 300 on the first connection member 100.

The base signal may be an intermediate-frequency (IF) signal or a baseband signal, and may include data encoded in a manner based on a communications protocol of an RF signal and/or a communications signal.

The RFIC 300 may process the base signal (e.g., by performing frequency conversion, filtering, and phase control) to generate an RF signal and/or a communications signal, and may process an RF signal and/or a communications signal to generate a base signal.

For example, the radio-frequency module 10a may further include electrical connection structures 150 including a base electrical connection structure 153 electrically connected to a base wiring 130 and disposed on a first surface (e.g., an upper surface) of the first connection member 100, and the RFIC 300 may be disposed on a second surface (e.g., a lower surface) of the first connection member 100.

For example, the electrical connection structures 150 including the base electrical connection structure 153 may be implemented as pins, solder balls, pads, or lands, and may support mounting of the first connection member 100 on a base substrate.

The first connection member 100 may include the base wiring 130 electrically connected to the base connection terminal 313 of the RFIC 300 and configured to transmit the base signal, and a first RF wiring 110 electrically connected to the first RF connection terminal 311 of the RFIC 300 and configured to transmit a first RF signal. The first connection member 100 may include a mounting area on which the RFIC 300 is mounted.

For example, the first connection member 100 may have a structure in which at least one insulating layer and at least one wiring layer are alternately stacked, and may be, for example, a printed circuit board (PCB).

The base wiring 130 and the first RF wiring 110 may have a structure in which a strip disposed on a horizontal plane (for example, an x-y plane) and a via extending in a vertical direction (for example, a z direction) are combined. The strip may be disposed on the at least one wiring layer of the first connection member 100, and the via may be disposed to penetrate the insulating layer of the first connection member 100.

The second connection member 200 may include a second RF wiring 211 electrically connected to the first RF wiring 110, and a third RF wiring 212 configured to transmit a first communications signal. At least a portion of the second connection member 200 may be more flexible than the first connection member 100, the RFIC 300, and the FEIC 500.

At least a portion of the second connection member 200 may be more flexible than the first connection member 100 so that the second connection member 200 may be bent. Therefore, a second outer side (e.g., a right side) of the second connection member 200 may be freely connected to an external connection object (e.g., an antenna coupled to a display member) without being substantially restricted by a position of a first outer side (e.g., a left side) of the second connection member 200, and the radio-frequency module 10a may be arranged freely, without being substantially limited by a structure of the external connection object.

For example, the second connection member 200 may be electrically connected to the first connection member 100 through the first outer side (e.g., the left side) of the second connection member 200, and the third RF wiring 212 may be electrically connected to the second outer side (e.g., the right side) of the second connection member 200 different from the first outer side of the second connection member 200. Therefore, the radio-frequency module 10a may be more freely connected to an external connection object (e.g., an antenna coupled to a display member) through the second outer side of the second connection member 200.

For example, the second connection member 200 may include at least one flexible insulating layer that may be more flexible than at least one insulating layer of the first connection member 100. For example, the at least one flexible insulating layer may be made of a polyimide or a liquid-crystal polymer (LCP), but is not limited thereto.

For example, the first and second connection members 100 and 200 may be implemented as rigid-flex printed circuit boards in which at least one insulating layer and at least one flexible insulating layer are stacked, and may be implemented in a manner in which a portion of the at least one insulating layer is removed from the second connection member 200. Therefore, even when at least a portion of the second connection member 200 is more flexible than the first connection member 100, a portion of the second connection member 200 may be made of the same material as first connection member 100 and may have the same flexibility as the first connection member 100.

According to a design, the first and second connection members 100 and 200 may be implemented as a flexible printed circuit board, and may be more flexible than the RFIC 300 and the FEIC 500.

The FEIC 500 may be mounted on a mounting area of the second connection member 200, and may be configured to amplify the first RF signal to generate the first communications signal or amplify the first communications signal to generate the first RF signal.

For example, the FEIC 500 may include one or more of a power amplifier, a low-noise amplifier, and a transmission/reception switch. The power amplifier, the low-noise amplifier, and the transmission/reception switch may be implemented as a combined structure of a semiconductor transistor element and an impedance element, but are not limited thereto.

A frequency of the first communications signal may be substantially the same as the frequency of the first RF signal, and the first communications signal may be transmitted to or received from an external connection object (e.g., an antenna coupled to a display member) through the second outer side (e.g., the right side) of the second connection member 200.

The FEIC 500 may be electrically connected to the second RF wiring 211 of the second connection member 200 through a first FE connection terminal 551, and may be electrically connected to the third RF wiring 212 of the second connection member 200 through a second FE connection terminal 552.

For example, a plurality of FE connection terminals 550 may include the first and second FE connection terminals 551 and 552, may be implemented as pins of the FEIC 500, or solder balls, pads, or lands of the second connection member 200, and may support mounting of the FEIC 500 on the second connection member 200.

Since the FEIC 500 may amplify the first RF signal and/or the first communications signal, the RFIC 300 may not include a front-end amplification circuit (e.g., a power amplifier or a low-noise amplifier).

Since securing performance (e.g., power consumption, linearity properties, noise properties, size, and gain) of the front-end amplification circuit may be more difficult than securing performance of a circuit that performs operations other than the front-end amplification operation in the RFIC 300, compatibility for a circuit that performs operations other than the front-end amplification operation in the RFIC 300 may be relatively low.

For example, the front-end amplification circuit may be implemented as a type of IC other than a conventional CMOS-based IC (e.g., a compound semiconductor), may be configured to have an efficient structure to receive an impedance of a passive device, or may be optimized for a specific performance and need to be implemented separately to secure the performance.

Therefore, the radio-frequency module 10a may have a structure in which the FEIC 500 performing a front-end amplification operation and the RFIC 300 performing an operation other than the front-end amplification operation re implemented separately to secure both performance of the front-end amplification circuit and performance of a circuit for performing an operation other than the front-end amplification operation in the RFIC 300.

In addition, power consumption and/or heat generation of the front-end amplification circuit may be greater than power consumption and/or heat generation of the circuit performing an operation other than the front-end amplification operation in the RFIC 300.

The radio-frequency module may have a structure in which the FEIC 500 performing the front-end amplification operation and the RFIC 300 performing an operation other than the front-end amplification operation are implemented separately to increase power consumption efficiency, and to more efficiently disperse heating paths.

Energy loss in transmission of the first RF signal and or the first communications signal may increase as powers of the RF signal and the communications signal increase. By separately implementing the FEIC 500 performing the front-end amplification operation and the RFIC 300 performing an operation other than the front-end amplification operation, the FEIC 500 may be closely connected to the external connection object (e.g., an antenna coupled to a display member).

An electrical distance of a transmission path of the final amplified first communications signal to the external connection object (e.g., an antenna coupled to a display member) may be shortened more easily, and energy efficiency of the radio-frequency module 10a may be further improved.

Although a total size of the RFIC 300 and the FEIC 500 may be larger than a size of an RFIC including an integrated front-end amplifier circuit, since the radio-frequency module 10a may include the first and second connection members 100 and 200 respectively including a mounting area on which the RFIC 300 is mounted and a mounting area on which the FEIC 500 is mounted, adequate mounting areas for the RFIC 300 and the FEIC 500 may be easily obtained. In addition, since a length of the radio-frequency module 10a may be easily reduced by bending the second connection member 200 due to the flexibility of at least a portion of the second connection member 200, the radio-frequency module 10a may have a relatively reduced size while providing the mounting areas for the RFIC 300 and the FEIC 500.

In addition, the radio-frequency module may efficiently compensate for a relatively poor antenna performance (e.g., a gain or a bandwidth) of the external connection object (e.g., an antenna coupled to a display member) that may be connected to the second outer side (e.g., the right side) of the second connection member 200.

For example, when the external connection object is an antenna coupled to a display member, a degree of design freedom of the antenna may be relatively low due to arrangement of the display member, and radiation pattern formation of the antenna may be disturbed by the display member. In addition, since a arrangement position of the antenna may be arranged at an edge of the display member to secure a relatively large area of the display member, the electrical distance between the antenna and the RFIC 300 may be longer, and a transmission loss between the antenna and the RFIC 300 may be even larger. Therefore, a performance of the antenna relative to a size of the antenna coupled to the display member may be lower than a performance of the antenna relative to a size of the antenna implemented in the conventional antenna component or the connection member.

The radio-frequency module 10a may include a structure in which the FEIC 500 performing the front-end amplification operation and the RFIC 300 performing an operation other than the front-end amplification operation are separately implemented, and may thus compensate more efficiently for a relatively low performance of the antenna of an external connection object (e.g., an antenna coupled to a display member).

Referring to FIG. 1B, a radio-frequency module 10b may include an RFIC 300, a first connection member 100, a second connection member 200, and an antenna component 400.

The RFIC 300 may include a base connection terminal 313 configured to transmit a base signal, a first RF connection terminal 311 configured to transmit a first radio-frequency (RF) signal having a frequency higher than a frequency of the base signal, and a second RF connection terminal 312 configured to transmit a second communications signal having a frequency higher than the frequency of the base signal.

The RFIC 300 may include a plurality of connection terminals 310 electrically connecting the RFIC 300 to the first connection member 100. The plurality of connection terminals 310 may include the first RF connection terminal 311, the second RF connection terminal, and the base connection terminal 313.

For example, the plurality of connection terminals 310 may be implemented as pins of the RFIC 300, or solder balls, pads, or lands of the first connection member 100, and may support mounting of the RFIC 300 on the first connection member 100.

The first connection member 100 may include a base wiring 130 electrically connected to the base connection terminal 313 of the RFIC 300 and configured to transmit the base signal, a first RF wiring 110 electrically connected to the first RF connection terminal 311 of the RFIC 300 and configured to transmit the first RF signal, and a first feedline 120 electrically connected to the second RF connection terminal 312 of the RFIC 300 and configured to transmit the second communications signal. The first connection member 100 may include a mounting area on which the RFIC 300 is mounted.

The first feedline 120 may be electrically separated from the first RF wiring 110, and may be implemented in the same manner as the first RF wiring 110. Therefore, the first feedline 120 may have a structure in which a strip disposed on a horizontal plane (for example, an x-y plane) and a via extending in a vertical direction (for example, a z direction) are combined.

The second connection member 200 may include a second RF wiring 210 electrically connected to the first RF wiring 110 of the first connection member 100, and a second feedline 220 electrically connected to the first feedline 120 of the first connection member 100. At least a portion of the second connection member 200 may be more flexible than the first connection member 100, the RFIC 300, and the antenna component 400.

The second connection member 200 may be electrically connected to the first connection member 100 through a first outer side (e.g., a left side) of the second connection member, and the second RF wiring 210 may be electrically connected to a second outer side (e.g., a right side) of the second connection member different from the first outer side of the second connection member.

The antenna component 400 may be mounted on a lower surface of the second connection member 200, may be electrically connected to the second feedline 220, and may be configured to transmit or receive the second communications signal.

For example, the antenna component 400 may include an antenna dielectric layer having a dielectric constant higher than a dielectric constant of the second connection member 200, and a plurality of connection terminals 450 disposed on an upper surface of the antenna dielectric layer and electrically connecting the antenna component 400 to the second connection member 200. The plurality of connection terminals 450 include a feed connection terminal 451 electrically connected to the second feedline 220 of the second connection member 200 and configured to transmit the second communications terminal. The antenna component 400 further includes a feed via disposed in the antenna dielectric layer, electrically connected to the feed connection terminal 451, and configured to transmit the second communications signal, and an antenna pattern 410 disposed on or in the antenna dielectric layer, electrically connected to the feed via 420, and configured to transmit or receive the second communications signal.

For example, the plurality of connection terminals 450 may be implemented as pins of the antenna component 400, or solder balls, pads, or lands of the second connection member 200, and may support mounting of the antenna component 400 on the second connection member 200.

Therefore, the radio-frequency module 10b may provide a transmission path of the first communications signal to an external connection object (e.g., an antenna coupled to a display member) through the second outer side (e.g., the right side) of the second connection member 200, and may transmit and/or receive the second communications signal through the antenna component 400.

For example, the antenna dielectric layer may be made of a ceramic material, and the ceramic material may include $Mg_2SiO_4$, $MgAlO_4$, or $CaTiO_3$, or may include polytetrafluoroethylene (PTFE), and may further include an adhesive material such as a polymer for providing a mounting area for the antenna pattern 410, but is not limited thereto.

Since the second connection member 200 including a mounting area for the antenna component 400 may be bent, the an antenna radiation direction of the second communications signal of the antenna component 400 may be adjusted more freely. Therefore, an electronic device in which the radio-frequency module 10b is disposed may efficiently implement a plurality of antenna radiation directions.

For example, when the external connection object is an antenna coupled to a display member, an antenna radiation direction of the antenna may be limited due to the arrangement of the display member.

Since the radio-frequency module 10b includes the antenna component 400 mounted on the second connection 200 that may be bent, an antenna radiation direction of the antenna component 400 may be freely adjusted by bending the second connection member 200 to compensate for the limited antenna radiation direction of the external connection object (e.g., an antenna coupled to a display member).

In addition, since the antenna component 400 may be separately manufactured with respect to the second connection member 200 and may be then mounted on the second connection member 200, it may be easy to implement the antenna component 400 to have a relatively high dielectric constant, and it may have a smaller size due to the relatively high dielectric constant. Therefore, the radio-frequency module 10b may more efficiently improve a performance of the antenna component 400 relative to a size thereof.

The radio-frequency module 10b may use the relatively high antenna performance of the antenna component 400 to compensate for an antenna performance that may be relatively weak with respect to the external connection object (e.g., an antenna coupled to a display member).

In addition, a frequency band (e.g., 60 GHz) of the antenna component 400 may be higher than a frequency (e.g., 28 GHz) of the first communications signal.

For example, when the external connection object is an antenna coupled to a display member, a frequency range the antenna is capable of transmitting and receiving may be narrowed due to the arrangement of the display member, and it may be inefficient to transmit and receive communications signals of a specific frequency band.

The antenna component 400 may easily have a relatively high dielectric constant, and may be configured and arranged in a relatively free manner, and thus may be capable of transmitting and receiving a wider frequency range than the antenna coupled to the display member.

The radio-frequency module 10b may use the antenna component 400 designed to transmit or receive a frequency band which may be inefficient for the external connection object (e.g., an antenna coupled to a display member), and thus may support more various frequency bands.

Referring to FIG. 1C, a radio-frequency module 10c may include an antenna component 400 and an FEIC 500.

For example, although not illustrated in FIG. 1C, the FEIC 500 and the antenna component 400 may be arranged on opposite surfaces of a second connection member 200.

For example, the FEIC 500 may be electrically connected between a second feedline 220 and the antenna component 400, and may be configured to further amplify a second communications signal. Therefore, the FEIC 500 may amplify a plurality of communications signals transmitted and received by different types of antennas at the same time.

In addition, a third RF wiring 212 may include an impedance transformer 222 configured to have a first transmission line impedance in a first direction, and a second transmission line impedance different from the first transmission line impedance in a second direction different from the first direction. For example, the impedance transformer 222 may have a shape in which a width of one end of the impedance transformer 222 and a width of another end of the impedance transformer 222 are different from each other.

Therefore, the radio-frequency module 10c may support matching an impedance of an external connection object (e.g., an antenna coupled to a display member) through a second outer side (e.g., a right side) of the second connection member 200.

In addition, the second connection member 200 may be configured so that a thickness (T2) of a middle portion of the second connection member 200 on which the FEIC 500 is mounted is thicker than a thickness (T1) of end portions of the second connection member 200. The different thicknesses of the second connection member 200 may correspond to different numbers of insulating layers and wiring layers of the second connection member 200. As the number of insulating layers and wiring layers increases, the FEIC 500 may more easily obtain an impedance matching structure for second and third RF wirings 211 and 212, or electromagnetic shielding performance or heat dissipation performance for the second and third RF wirings 211 and 212. Therefore, when a thickness (T2) of the middle portion of the second connection member 200 on which the FEIC 500 is mounted is relatively thick, an overall performance of the FEIC 500 may be more easily improved.

For example, the second connection member 200 may be configured so that the end portions having the relatively thin thickness (T1) are more flexible than the middle portion having the relatively thick thickness (T2). For example, when the first and second connection members 100 and 200 are parts of a rigid-flex PCB, an insulating layer of the relatively thick portion of the second connection member 200 may not be removed.

Figure 2A:
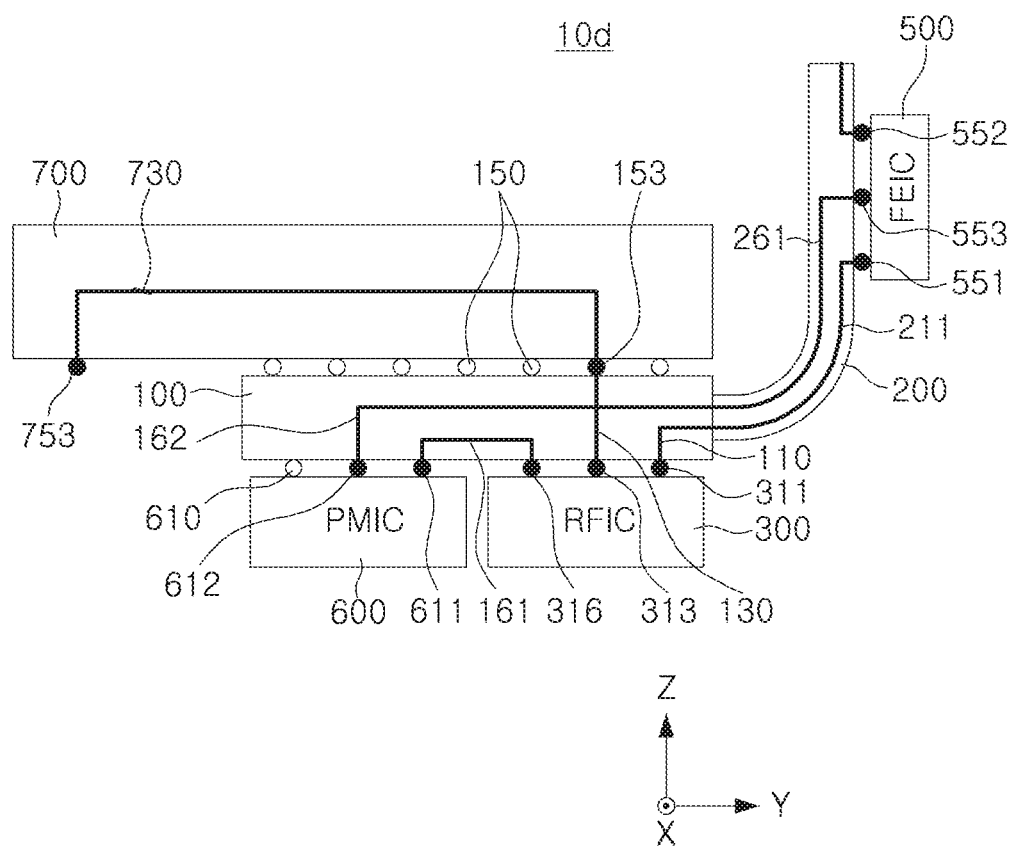
FIGS. 2A and 2B are views illustrating examples of a radio-frequency module including a power management integrated circuit (PMIC).
Figure 2B:
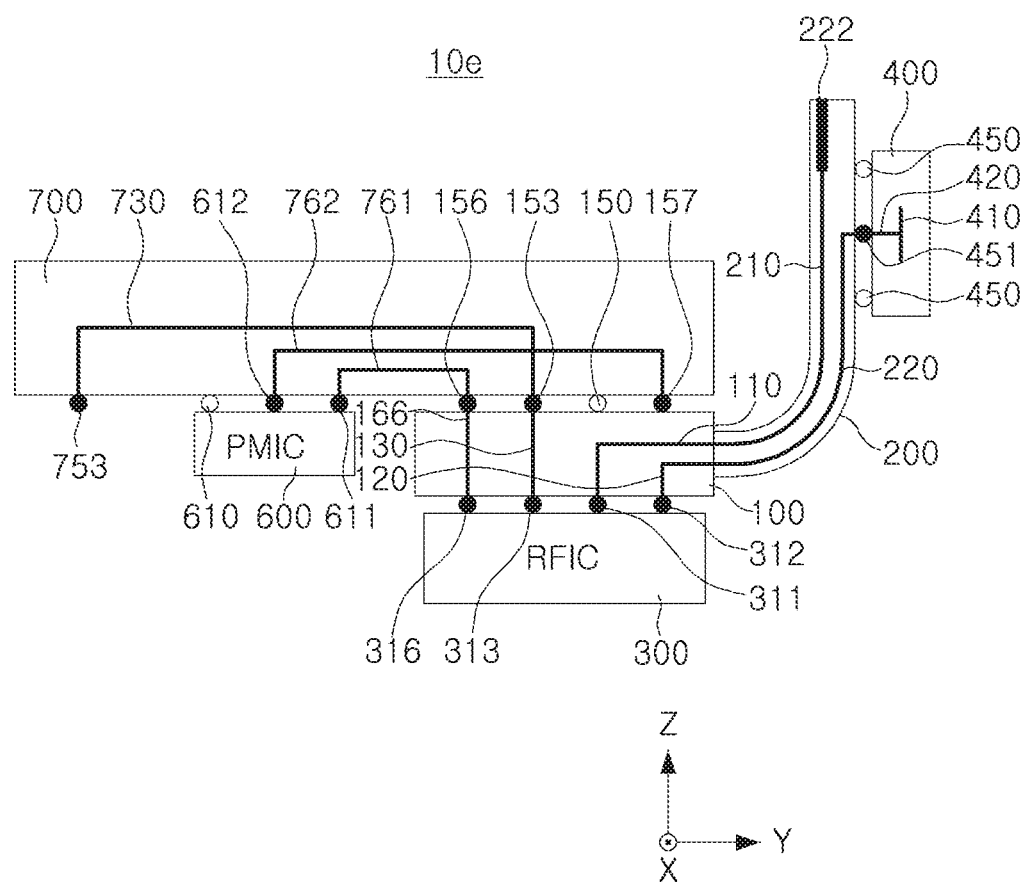

FIGS. 2A and 2B are views illustrating examples of a radio-frequency module including a power management integrated circuit (PMIC).

Referring to FIGS. 2A and 2B, radio-frequency modules 10d and 10e may further include a power management integrated circuit (PMIC) 600. The PMIC 600 may supply power to an RFIC 300 through a first PM connection terminal 611, and may supply power to an FEIC 500 through a second PM connection terminal 612.

A plurality of PM connection terminals 610 may include the first and second PM connection terminals 611 and 612, may be implemented as pins of the PMIC 600, or solder balls, pads, or lands of a first connection member 100 or a base substrate 700, and may support mounting of the PMIC 600 on the first connection member 100 as shown in FIG. 2A or the base substrate 700 as shown in FIG. 2B.

Referring to FIG. 2A, the PMIC 600 may be mounted on the first connection member 100, a plurality of connection terminals of the RFIC 300 may further include a power connection terminal 316, and the first connection member 100 may further include a first power wiring 161 electrically connected between the first PM connection terminal 611 of the PMIC 600 and the power connection terminal 316 of the RFIC 300, and a second power wiring 162 electrically connected between the second PM connection terminal 612 and a right surface of the first connection member 100. The FEIC 500 may further include a power connection terminal 553, and the second connection member 200 may further include a second power wiring 261 electrically connected between the first power wiring 161 of the first connection member 100 and the power connection terminal 553 of the FEIC 500.

Referring to FIG. 2B, the PMIC 600 may be mounted on the base substrate 700, the first connection member 100 may further include first and second power supply electrical connection structures 156 and 157 electrically connected to the PMIC 600, and may further include first and second power wirings 761 and 762 respectively electrically connected between the first and second power supply electrical connection structures 156 and 157 and the first and second PM connection terminals 611 and 612 of the PMIC 600. The first connection member may further include a power wiring 166 electrically connected between the first power supply electrical connection structure 156 of the first connection member 100 and the power connection terminal 316 of the RFIC 300.

Referring to FIGS. 2A and 2B, the base substrate 700 may include a base electrical connection structure 753 and a base wiring 730 electrically connected between the base electrical connection structures 153 and 753 to provide an electrical path between the RFIC 300 and the base electrical connection structure 753.

For example, the base electrical connection structure 753 may be electrically connected to an intermediate-frequency integrated circuit (IFIC) or a baseband IC, and may support mounting of the IFIC or the baseband IC on the base substrate 700.

Figure 2C:
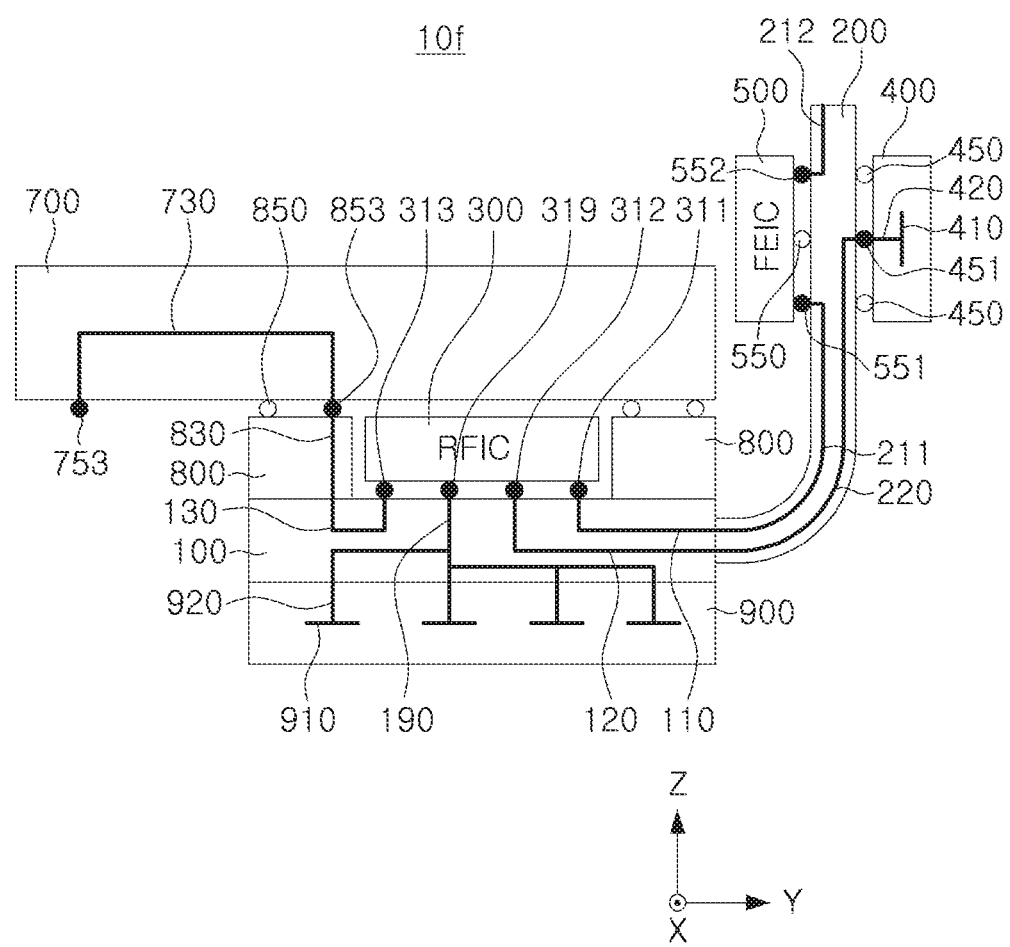
FIG. 2C is a view illustrating an example of a radio-frequency module including an antenna package.

FIG. 2C is a view illustrating an example of a radio-frequency module including an antenna package.

Referring to FIG. 2C, a radio-frequency module 10f may further include a support member 800 and an antenna package 900.

The support member 800 may be disposed on a first surface (e.g., an upper surface) of a first connection member 100, may surround at least a portion of an RFIC 300 mounted on the first surface (e.g., the upper surface) of the first connection member 100, may include a plurality of electrical connection structures 850 including a base electrical connection structure 853 connected to a base wiring 730 of a base substrate 700, and may include a base wiring 830 connected between the base electrical connection structure 853 of the support member 800 and a base wiring 130 of the first connection member 100. The support member may be mounted on a lower surface of the base substrate 700 via the electrical connection structures 850 including the base electrical connection structure 853.

Therefore, the support member 800 may provide a base signal transmission path and a power supply path for the RFIC 300 (the power supply path is not shown in FIG. 2C), and may also support a heat dissipation performance and/or an electromagnetic shielding performance of the RFIC 300.

The RFIC 300 may include a base connection terminal 313 and a third RF connection terminal 319, and may process a base signal received from the base connection terminal 313 to generate a third communications signal and transmit the third communications signal to the third RC connection terminal 319, or may process a third communications signal received from the third RF connection terminal 319 to generate a base signal and transmit the base signal to the base connection terminal 313.

The first connection member 100 may include a third feedline 190 having one end electrically connected to the third RF communication terminal 319 at a first surface (e.g., an upper surface) of the first connection member 100, and being configured to transmit the third communications signal. The third feedline 190 may branch into a plurality of branch feedlines extending to a second surface (e.g. a lower surface) of the first connection member 100.

The antenna package 900 may be mounted on the second surface (e.g., the lower surface) of the first connection member 100, and may include a plurality of feed vias 920 respectively electrically connected to the branch feedlines of the third feedline 190 of the first connection member 100 and configured to transmit the third communications signal, and a plurality of patch antennas 910 respectively electrically connected to the plurality of feed vias 920 and configured to transmit or receive the third communications signal.

Therefore, the radio-frequency module 10f may transmit or receive an RF signal in a-z direction through the antenna package 900.

Figure 3A:
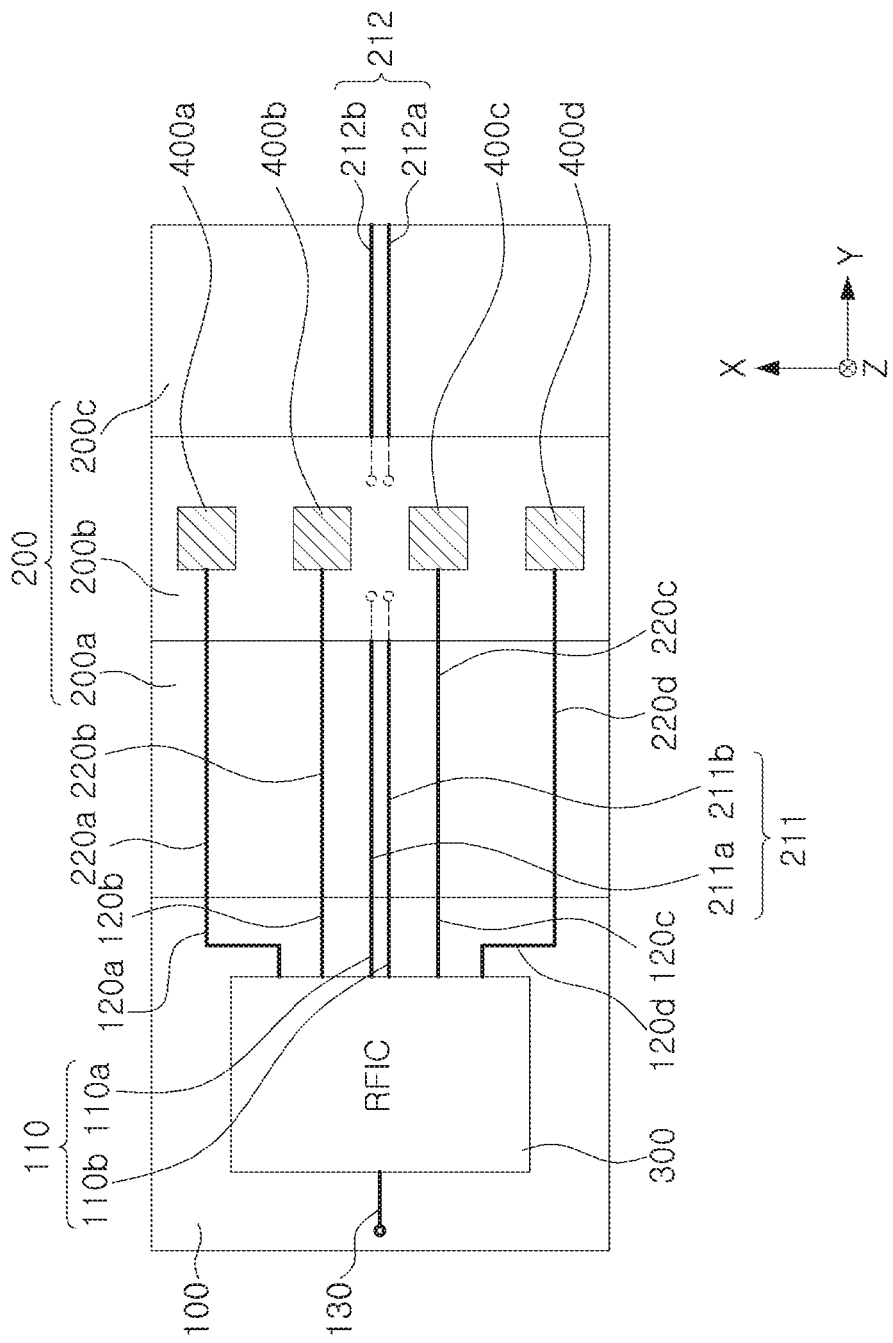
FIGS. 3A and 3B are views respectively illustrating examples of a lower surface and an upper surface of a radio-frequency module similar to the radio-frequency module of FIG. 1C.
Figure 3B:
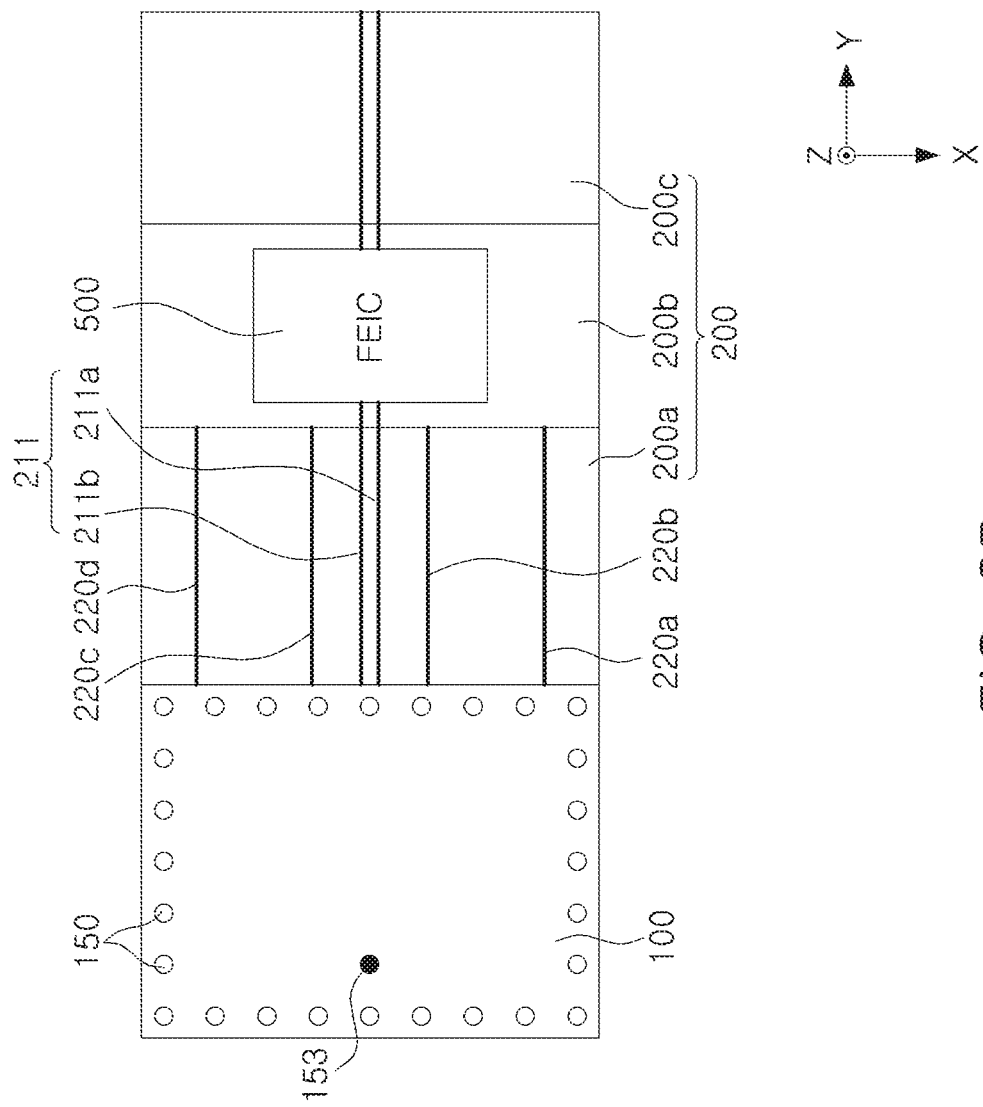

FIGS. 3A and 3B are views respectively illustrating examples of a lower surface and an upper surface of a radio-frequency module similar to the radio-frequency module of FIG. 1C.

Referring to FIGS. 3A and 3B, a radio-frequency module includes a first connection member 100, a second connection member 200, an RFIC 300 mounted on a lower surface of the first connection member 100, a plurality of antenna components 400a, 400b, 400c, and 400d mounted on a lower surface of the second connection member 200, and an FEIC 500 mounted on an upper surface of the second connection member.

The second connection member 200 includes a left end portion 200a connected to a right side of the first connection member 100, a middle portion 200b, and a right end portion 200c. The antenna components 400a, 400b, 400c, and 400d are mounted on a bottom surface of the middle portion 200b of the second connection member 200, and the FEIC 500 is mounted on an upper surface of the middle portion of the second connection member 200. A right side of the second connection member 200 may be connected to an external connection object (e.g., an antenna coupled to a display member).

The left end portion 200a and the right end portion 200c of the second connection member 200 may be thinner than the middle portion 200b of the second connection member 200, and may also be thinner than the first connection member 100. The left end portion 200a and the right end portion 200c of the second connection member 200 may be more flexible than the first connection member 100 and the middle portion 200b of the second connection member 200 to enable the left end portion 200a and the right end portion 200c of the second connection member 200 to bent.

For example, the second connection member 200 may be made of a rigid-flex PCB in which the middle portion 200b of the second connection 200 is a rigid portion of the rigid-flex PCB, and the left end portion 200a and the right end portion 200c of the second connection member 200 are flex portions of the rigid-flex PCB. However, this is just an example, and the second connection member 200 may be implemented in other ways so that the left end portion 200a and the right end portion 200c of the second connection member 200 are more flexible than the first connection member 100 and the middle portion 200b of the second connection member 200, for example, as described above with respect to FIGS. 1A, 1B, and 1C.

The first connection member 100 includes a base wiring 130 and a plurality of electrical connection structures 150 including a base electrical connection structure 153. The base wiring 130 is electrically connected between the base electrical connection structure 153 and the RFIC 300 to transmit a base signal from the base electrical connection structure 153 to the RFIC 300, and to transmit a base signal from the RFIC 300 to the base electrical connection structure 153. The base signal may be a intermediate-frequency (IF) signal or a baseband signal.

The RFIC 300 processes a base signal to generate a first RF signal and a second communications signal, and processes a first RF signal and a second communications signal to generate a base signal. Respective frequencies of the first RF signal and the second communications signal may be higher than a frequency of the base signal, and the frequency of the second communications signal may be different from the frequency of the first RF signal. For example, the frequency of the second communications signal may be higher than the frequency of the first RF signal.

The first connection member 100 also includes a plurality of first RF wirings 110 including first RF wirings 110a and 110b electrically connected to the RFIC 300 to transmit a first RF signal from the RFIC 300 to the right side of the first connection member 100, and transmit a first RF signal from the right side of the first connection member to the RFIC 300, and a plurality of first feedlines 120 including first feedlines 120a, 120b, 120c, and 120d electrically connected to the RFIC 300 to transmit a second communications signal from the RFIC 300 to the right side of the connection member 100, and transmit a second communications signal from the right side of the connection member 100 to the RFIC 300.

The second connection member 200 includes a plurality of second RF wirings 211 including second RF wirings 211a and 211b respectively electrically connected to the first RF wirings 110a and 110b of the first connection member 100 and electrically connected to the FEIC 200 to transmit a first RF signal from the left side of the second connection member 200 to the FEIC 500, and transmit a first RF signal from the FEIC 500 to the left side of the second connection member 200, and a plurality of third RF wirings 212 including third RF wirings 212a and 212b electrically connected to the FEIC 500 to transmit a first communications signal from the FEIC 500 to the right side of the second connection member 200, and transmit a first communications signal from the right side of the second connection member 200 to the FEIC 500.

The second connection member 200 also includes a plurality of second feedlines 220 including second feedlines 220a, 220b, 220c, and 220d respectively connected to the first feedlines 120a, 120b, 120c, and 120d of the first connection member 100 and the antenna components 400a, 400b, 400c, and 400d to transmit a second communications signal from the left side of the second connection member 200 to the antenna components 400a, 400b, 400c, and 400d, and transmit a second communications signal from the antenna components 400a, 400b, 400c, and 400d to the left side of the second connection member 200.

FIGS. 4A to 4D are views illustrating examples of a radio-frequency module and an electronic device including the same.

Referring to FIGS. 4A to 4D, electronic devices 20a, 20b, 20c, and 20d include a case 60, and a base substrate 700, a display member 90, and a battery 70 disposed in the case 60.

The display member 90 is configured to display an image. For example, the display member 90 includes a cover member 91, a display panel 92, and a touch sensor panel 93. An antenna (not shown in FIGS. 4A-4D, but shown in FIGS. 5A and 5B) coupled to the display member 90 is coupled to the display panel 92.

For example, the cover member 91 may be made of a material that may be transparent, such as glass, and may protect the display member 90 from external impacts.

Since the display member 90 has a structure in which the display panel 92 and the touch sensor panel 93 are combined, the display member 90 may sense a touch on the display member 90 by a user of the electronic devices 20a, 20b, 20c, and 20d.

According to a design, the display panel 92 may include a relatively flexible display material such as an organic light-emitting diode (OLED), and may be bent, but is not limited thereto.

The electronic devices 20a, 20b, 20c, and 20d further include a first connection member 100. The first connection member 100 includes electronic connection terminals 150 that connect an upper surface of the first connection member 100 to a lower surface of the base substrate 700. An RFIC 300 and a PMIC 600 are mounted on a lower surface of the first connection member 100, and are encapsulated by an encapsulant layer 180.

The electronic devices 20a, 20b, 20c, and 20d further include a second connection member 200 including a first end portion connected to a right side of the first connection member 100, and a second end portion connected to the antenna (not shown) coupled to the display member 90 at a right end of the display panel 92 of the display member 90. The first end portion and the second end portion of the second connection member 200 are flexible, and were bent when the electronic devices 20a, 20b, 20c, and 20d were assembled. A middle portion of the second connection member 200 between the first end portion and the second end portion of the second connection member 200 is not as flexible as the first end portion and the second end portion of the second connection member 200, and may be rigid.

Figure 4A:
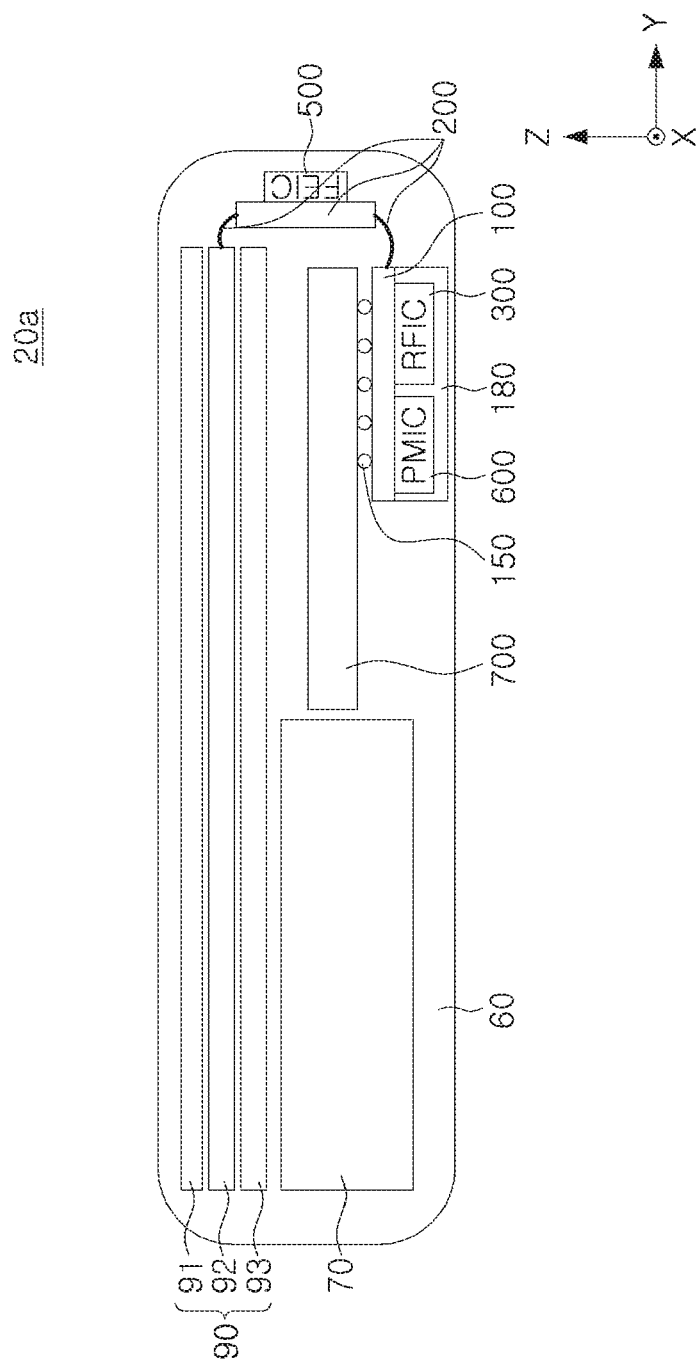
FIGS. 4A to 4D are views illustrating examples of a radio-frequency module and an electronic device including the same.

Referring to FIG. 4A, the electronic device 20a further includes an FEIC 500 mounted on a right surface of the middle portion of the second connection member 200. The first connection member 100, the electronic connection terminals 150, the encapsulant layer 180, the second connection member 200, the RFIC 300, the FEIC 500, and the PMIC 600 form a radio-frequency module similar to the radio-frequency modules 10a of FIG. 1A and 10d of FIG. 2A.

Figure 4B:
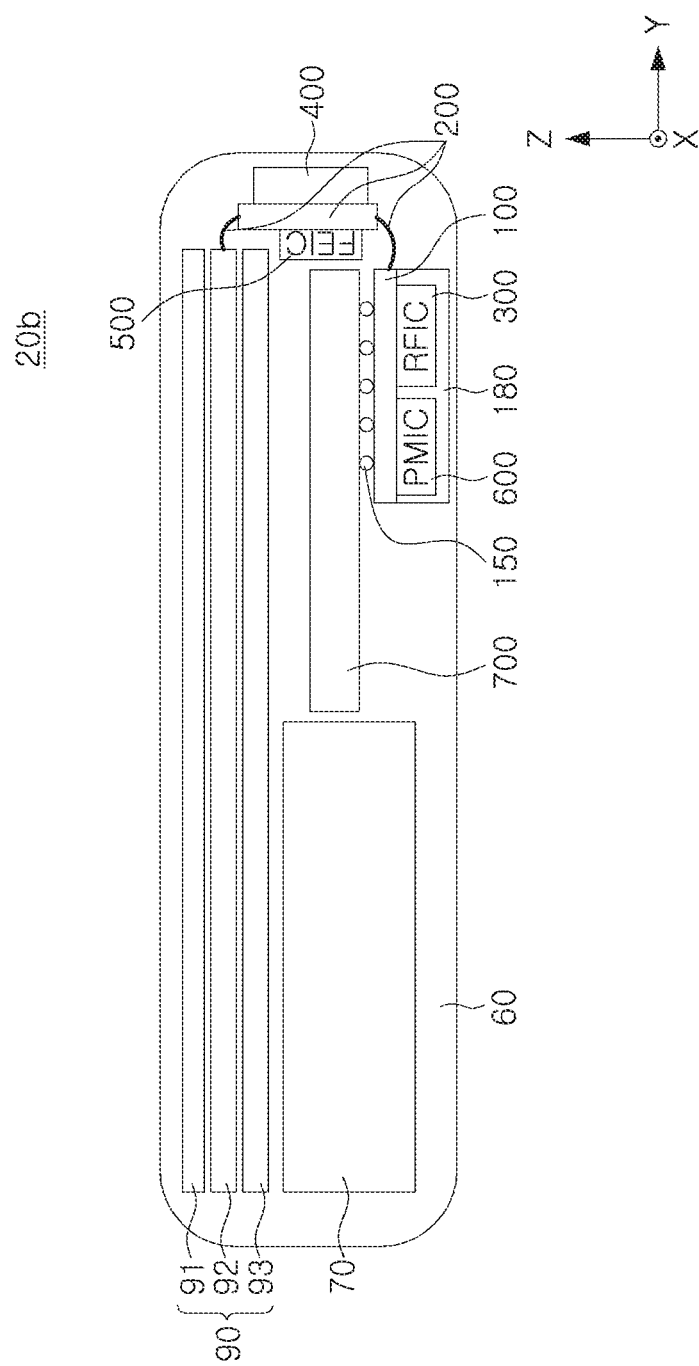

Referring to FIG. 4B, the electronic device 20b further includes an antenna component 400 mounted on a right surface of the middle portion of the second connection member 200, and an FEIC 500 mounted on a left surface of the middle portion of the second connection member 200. The first connection member 100, the electronic connection terminals 150, the encapsulant layer 180, the second connection member 200, the RFIC 300, the antenna component 400, the FEIC 500, and the PMIC 600 form a radio-frequency module similar to the radio-frequency module 10c of FIG. 1C and the radio-frequency module of FIGS. 3A and 3B.

Figure 4C:
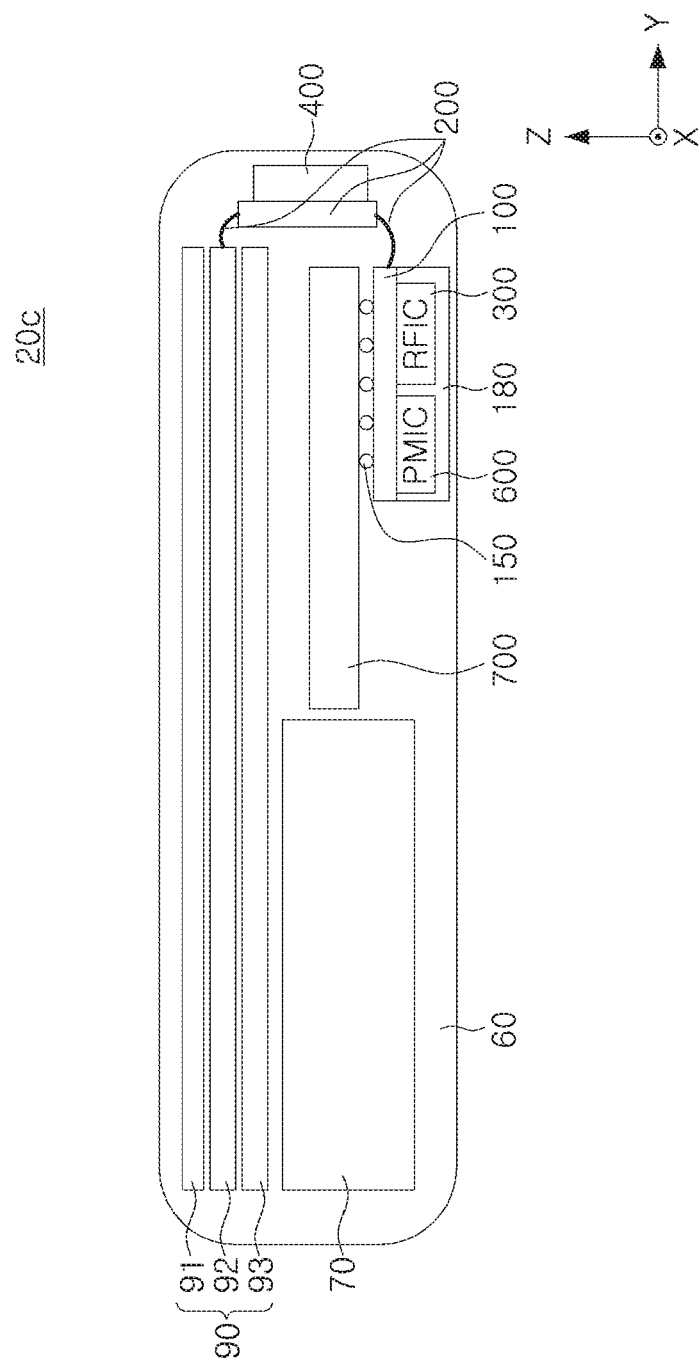

Referring to FIG. 4C, the electronic device 20c further includes an antenna component 400 mounted on a right surface of the middle portion of the second connection member 200. The first connection member 100, the electronic connection terminals 150, the encapsulant layer 180, the second connection member 200, the RFIC 300, the antenna component 400, and the PMIC 600 form a radio-frequency module similar to the radio-frequency modules 10b of FIG. 1B and 10e of FIG. 2B.

Figure 4D:
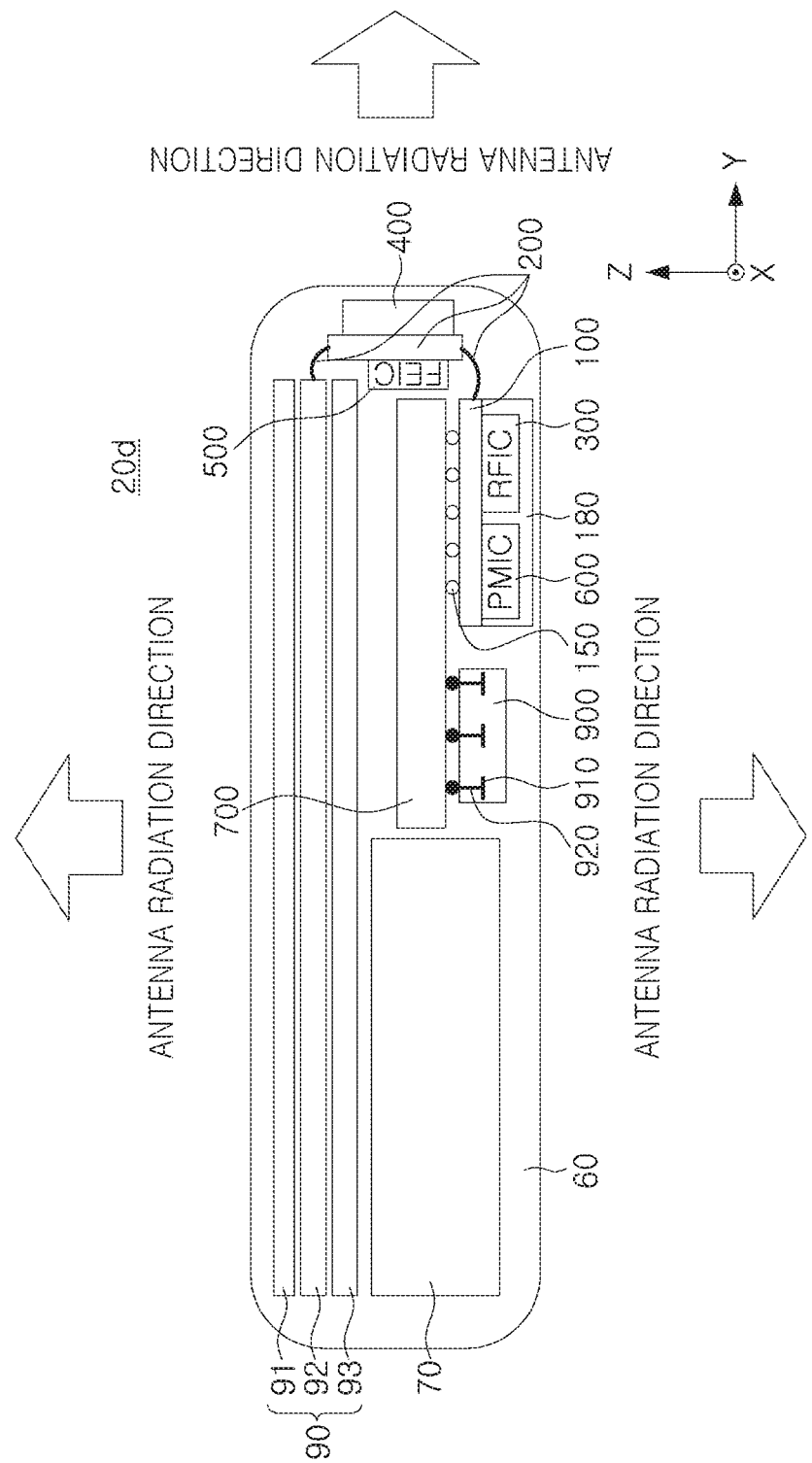

Referring to FIG. 4D, the electronic device 20d includes an antenna component 400 mounted on a right surface of the middle portion of the second connection member 200, an FEIC 500 mounted on a left surface of the second connection member 200, and an antenna package 900 mounted on the lower surface of the base substrate 700, rather than on the lower surface of the first connection member 100 as shown in FIG. 2C. The first connection member 100, the electronic connection terminals 150, the encapsulant layer 180, the second connection member 200, the RFIC 300, the antenna component 400, the FEIC 500, the PMIC 600, and the antenna package 900 form a radio-frequency module similar to the radio-frequency module 10f of FIG. 2C. By providing the electronic device 20d with the antenna coupled to the display member 90, the antenna component 400, and the antenna package 900, the electronic device 20d may have three different antenna radiation directions as indicated in FIG. 4D.

For example, the electronic devices 20a, 20b, 20c, and 20d may be a smartphone, a personal digital assistant, a digital video camera, a digital still camera, a network system, a computer, a monitor, a tablet PC, a laptop computer, a netbook computer, a television set, a video game, a smartwatch, or an automobile, but are not limited thereto.

The base substrate 700 may include a communications module. The communications module may include one or more of a memory chip such as a volatile memory (for example, a dynamic random-access memory (DRAM)), a nonvolatile memory (for example, a read-only memory (ROM)), or a flash memory; an application processor chip such as a central processor (for example, a central processing unit (CPU)), a graphics processor (for example, a graphics processing unit (GPU)), a digital signal processor, a cryptographic processor, a microprocessor, or a microcontroller; and a logic chip such as an analog-to-digital converter or an application-specific integrated circuit (ASIC) to perform digital signal processing.

Figure 5A:
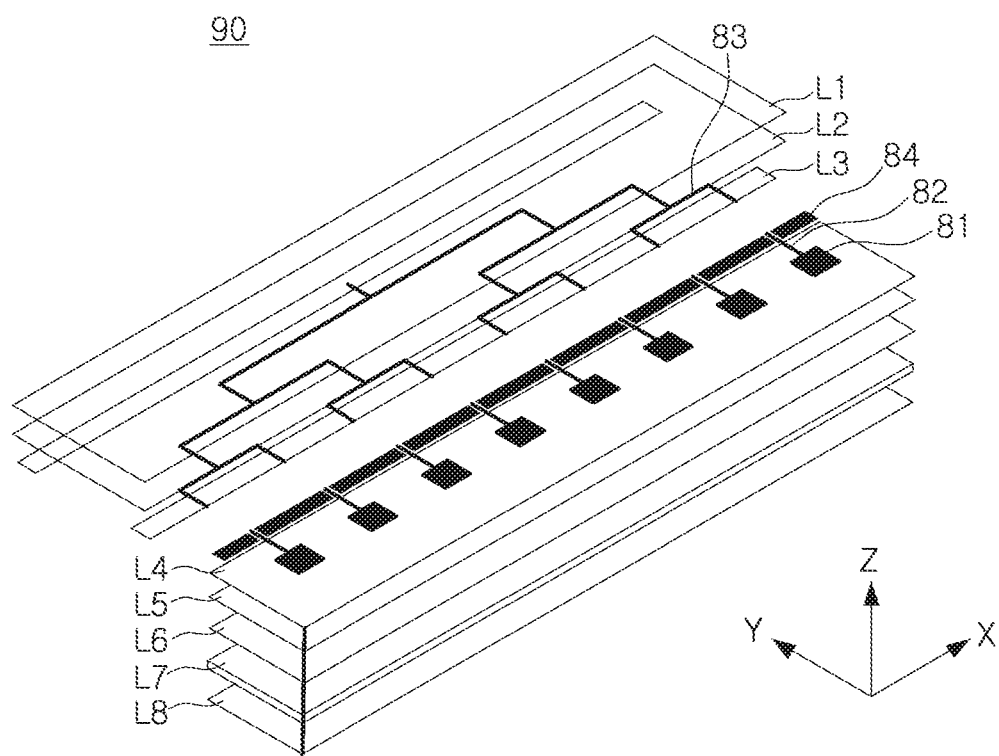
FIGS. 5A and 5B are views illustrating an example of a display member that may be included in an electronic device.
Figure 5B:
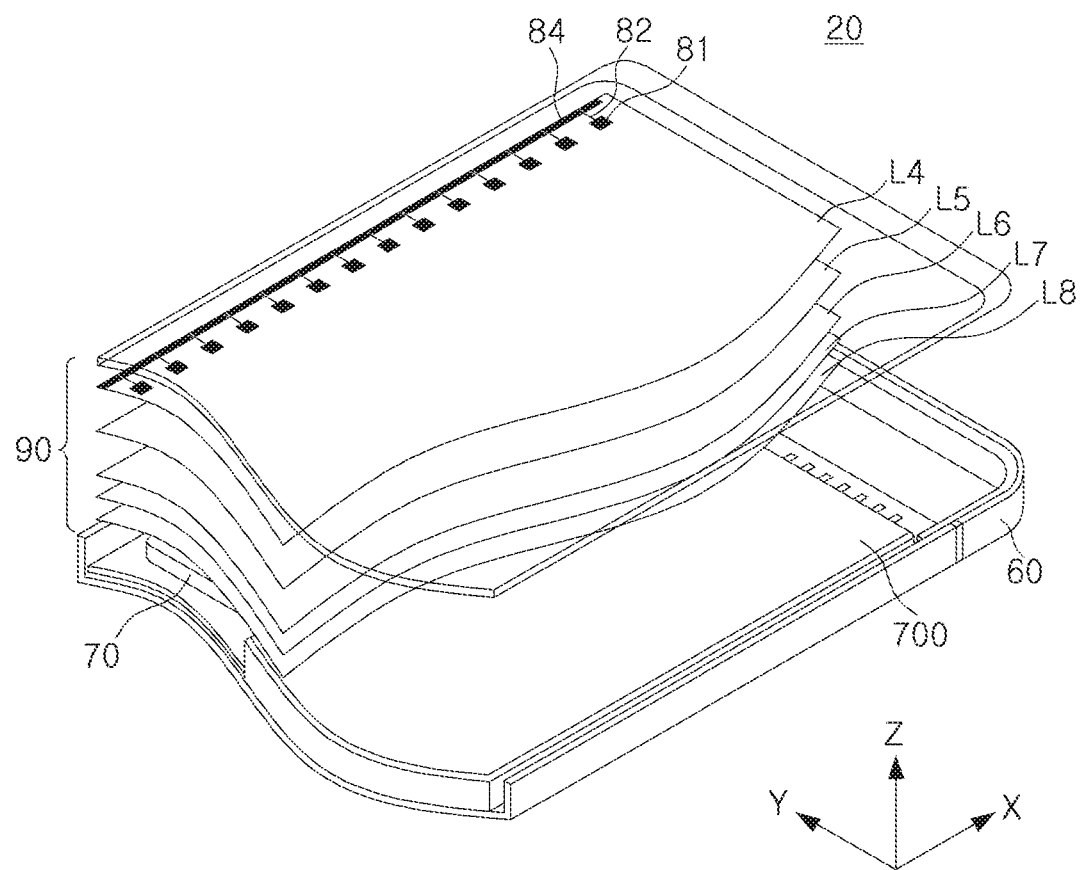

FIGS. 5A and 5B are views illustrating an example of a display member that may be included in an electronic device.

Referring to FIGS. 5A and 5B, an electronic device, such as the electronic devices 20a, 20b, 20c, and 20d, may include a display member 90 disposed in a case 60 of the electronic device, and a plurality of antennas 81 may be coupled to the display member 90, and may be electrically connected to a radio-frequency module, such as the radio-frequency modules 10a, 10b, 10c, 10d, 10e, and 10f of FIGS. 1A, 1B, 1C, 2A, 2B, and 2C and the radio-frequency module of FIGS. 3A and 3B.

The plurality of antennas 81 may be arranged along an edge of the display member 90, may be fed an first RF signal or a first communications signal from the radio-frequency module via a plurality of RF wirings 83 and a plurality of interface strips 82 respectively electrically connected to the RF wirings 83, may be electromagnetically coupled to a ground member 84 to have a predetermined resonant frequency (e.g., 28 GHz), and may be designed to have a thickness thinner than a thickness of a conductive layer of a conventional printed circuit board.

The display member 90 includes layers L1, L2, L3, L4, L5, L6, L7, and L8. Layer L1 includes the RF wirings 83, which may be made of copper (Cu). L2 is a liquid-crystal polymer (LCP) layer. Layer L3 includes metal strips, which may be made of copper (Cu). Layer L4 is a transparent antenna layer, and may be made, for example, of a silver (Ag) alloy. The antennas 81 and the interface strips 82 are disposed on the transparent antenna layer L4. Layer L5 is a transparent film. Layer L6 is an optically clear adhesive (OCA) layer. L7 is a glass layer. Layer L8 is a transparent antenna ground layer, and be made, made, for example of a silver (Ag) alloy.

The display member 90 may display an image in the vertical direction (for example, the z direction). It may be difficult for the display member 90 to display an image through an area in which the plurality of antennas 81, the plurality of interface strips 82, and the ground member 84 are arranged.

Therefore, a degree of design freedom of the plurality of antennas 81, the plurality of interface strips 82, and the ground member 84 may be limited, an output power and/or a gain of the plurality of antennas 81 may be low relative to a conventional antenna component, and a radiation pattern forming direction of the plurality of antennas 81 may also be limited.

The radio-frequency module and the electronic device may compensate for a low output power and/or a low gain of the plurality of antennas 81 by providing an FEIC electrically connected to the plurality of antennas 81, and may remotely transmit and receive an RF signal in a direction different from the radiation pattern forming direction of the plurality of antennas 81.

The wirings, vias, feedlines, strips, interface strips, ground members, and antenna patterns disclosed herein may be made of a metal material (e.g., a conductive material such as copper (Cu), aluminum (Al), silver (Ag), tin (Sn), gold (Au), nickel (Ni), lead (Pb), or titanium (Ti), or an alloy of any two or more thereof), and may be formed by a plating method, such as a chemical vapor deposition (CVD) process, a physical vapor deposition (PVD) process, a sputtering process, a subtractive process, an additive process, a semi-additive process (SAP), or a modified semi-additive process mSAP, but are not limited thereto.

The insulating layers of the connection members disclosed herein may be made of a prepreg, FR4, a thermosetting resin such as an epoxy resin, a thermoplastic resin, or a resin such as a thermosetting resin or a thermoplastic resin impregnated together with an organic filler into a core material such as a glass fiber, a glass cloth, or a glass fabric, Ajinomoto Build-Up Film (ABF), a bismaleimide triazine (BT) resin, a photoimageable dielectric (PID) resin, a copper-clad laminate (CCL), or a ceramic-based insulating material.

The RF signals referred to herein may have a format according to Wi-Fi (IEEE 802.11 family), Worldwide Interoperability for Microwave Access (WiMAX) (IEEE 802.16 family), IEEE 802.20, Long Term Evolution (LTE), Evolution-Data Optimized (EV-DO), Evolved High Speed Packet Access (HSPA+), High Speed Downlink Packet Access (HSDPA), High Speed Uplink Packet Access (HSUPA), Enhanced Data Rates for GSM Evolution (EDGE), Global System for Mobile Communications (GSM), Global Positioning System (GPS), General Packet Radio Service (GPRS), Code-Division Multiple Access (CDMA), Time-Division Multiple Access (TDMA), Digital Enhanced Cordless Telecommunications (DECT), Bluetooth, 3G, 4G, 5G, and any other wireless and wired protocols, but are not limited thereto.

Further, a frequency of the RF signal (for example, 24 GHz, 28 GHz, 36 GHz, 39 GHz, or 60 GHz) is greater than a frequency of the IF signal (for example, 2 GHz, 5 GHz, or 10 GHz).

A radio-frequency module may efficiently compensate for antenna performance of an external connection object (e.g., an antenna coupled to a display member) without being significantly restricted by a structure of the external connection object.

A radio-frequency module may provide an additional antenna remote communications direction without being significantly restricted by a structure of an external connection object.

An electronic device may efficiently compensate for limited antenna performance of a display coupling antenna.

An electronic device may efficiently extend a limited antenna communications direction of a display coupling antenna.

While this disclosure includes specific examples, it will be apparent after an understanding of the disclosure of this application that various changes in form and details may be made in these examples without departing from the sprit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio-frequency module comprising:
   a radio-frequency integrated circuit (RFIC) comprising a base connection terminal configured to transmit a base signal, and a first radio-frequency (RF) connection terminal configured to transmit a first RF signal having a frequency higher than a frequency of the base signal;
   a first connection member comprising a mounting area on which the RFIC is mounted, a base wiring electrically connected to the base connection terminal of the RFIC and configured to transmit the base signal, and a first RF wiring electrically connected to the first RF connection terminal of the RFIC and configured to transmit the first RF signal;

a second connection member comprising a second RF wiring electrically connected to the first RF wiring of the first connection member and configured to transmit the first RF signal, and a third RF wiring configured to transmit a first communications signal having a frequency higher than the frequency of the base signal, at least a portion of the second connection member being more flexible than the first connection member; and a front-end integrated circuit (FEIC) mounted on the second connection member, electrically connected to the second RF wiring and the third RF wiring of the second connection member, and configured to amplify the first RF signal to generate the first communications signal or amplify the first communications signal to generate the first RF signal.

2. The radio-frequency module according to claim 1, wherein the second connection member is electrically connected to the first connection member through a first outer side of the second connection member, and the third RF wiring is electrically connected to a second outer side of the second connection member different from the first outer side of the second connection member.

3. The radio-frequency module according to claim 1, wherein the third RF wiring comprises an impedance transformer configured to have a first transmission line impedance in a first direction, and a second transmission line impedance different from the first transmission line impedance in a second direction different from the first direction.

4. The radio-frequency module according to claim 1, further comprising an electrical connection structure electrically connected to the base wiring of the first connection member and disposed on a first surface of the first connection member, wherein the RFIC is mounted on a second surface of the first connection member.

5. The radio-frequency module according to claim 1, wherein the RFIC is mounted on a first surface of the first connection member, and the radio-frequency module further comprises a support member disposed on the first surface of the first connection member, configured to surround at least a portion of the RFIC, and electrically connected to the base wiring of the first connection member.

6. The radio-frequency module according to claim 5, further comprising an antenna package mounted on a second surface of the first connection member, and comprising a plurality of patch antennas electrically connected to the RFIC through the first connection member.

7. The radio-frequency module according to claim 1, further comprising a power management integrated circuit (PMIC) mounted on the first connection member and configured to supply power to the RFIC and the FEIC.

8. The radio-frequency module according to claim 1, wherein the second connection member comprises a middle portion on which the FEIC is mounted, and two end portions disposed at opposite ends of the middle portion, and a thickness of the middle portion is greater than respective thicknesses of the two end portions.

9. The radio-frequency module according to claim 1, wherein the RFIC further comprises a second RF connection terminal configured to transmit a second communications signal having a frequency higher than the frequency of the base signal, the first connection member further comprises a first feedline electrically connected to the second RF connection terminal of the RFIC and configured to transmit the second communications signal, the second connection member further comprises a second feedline electrically connected to the first feedline of the first connection member and configured to transmit the second communications signal, and the radio-frequency module further comprises an antenna component mounted on the second connection member, electrically connected to the second feedline of the second connection member, and configured to transmit or receive the second communications signal.

10. The radio-frequency module according to claim 9, wherein the antenna component comprises:

an antenna dielectric layer having a dielectric constant higher than a dielectric constant of the second connection member;

a feed connection terminal disposed on the antenna dielectric layer, electrically connected to the second feedline of the second connection member, and configured to transmit the second communications signal;

a feed via disposed in the antenna dielectric layer, electrically connected to the feed connection terminal, and configured to transmit the second communications signal; and an antenna pattern disposed on or in the antenna dielectric layer, electrically connected to the feed via, and configured to transmit or receive the second communications signal.

11. The radio-frequency module according to claim 9, wherein the FEIC and the antenna component are respectively mounted on different surfaces of the second connection member.

12. The radio-frequency module according to claim 9, wherein a frequency band of the antenna component is higher than the frequency of the first communications signal.

13. The radio-frequency module according to claim 1, further comprising an antenna component mounted on the second connection member, electrically connected to a second feedline, and configured to transmit or receive a second communications signal, wherein the RFIC further comprises a second RF connection terminal configured to transmit a second communications signal, the first connection member further comprises a first feedline electrically connected to the second RF connection terminal of the RFIC and configured to transmit the second communications signal, the second connection member further comprises a second feedline electrically connected to the first feedline of the first connection member, the radio-frequency module further comprises an antenna component mounted on the second connection member and further configured to transmit and receive the second communications signal, and the FEIC is electrically connected between the second feedline of the second connection member and the antenna component and is configured to further amplify the second communications signal.

* * * * *